(12) United States Patent
Ogiwara et al.

(10) Patent No.: US 12,128,498 B2
(45) Date of Patent: Oct. 29, 2024

(54) LASER PROCESSING METHOD, AND LASER PROCESSING DEVICE

(71) Applicant: HAMAMATSU PHOTONICS K.K., Hamamatsu (JP)

(72) Inventors: Takafumi Ogiwara, Hamamatsu (JP); Yuta Kondoh, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 805 days.

(21) Appl. No.: 15/762,174

(22) PCT Filed: Aug. 17, 2016

(86) PCT No.: PCT/JP2016/074039
§ 371 (c)(1),
(2) Date: Mar. 22, 2018

(87) PCT Pub. No.: WO2017/056769
PCT Pub. Date: Apr. 6, 2017

(65) Prior Publication Data
US 2018/0272465 A1    Sep. 27, 2018

(30) Foreign Application Priority Data

Sep. 29, 2015 (JP) ................................. 2015-191092

(51) Int. Cl.
*B23K 26/08*   (2014.01)
*B23K 26/00*   (2014.01)
(Continued)

(52) U.S. Cl.
CPC ...... *B23K 26/0869* (2013.01); *B23K 26/0006* (2013.01); *B23K 26/04* (2013.01);
(Continued)

(58) Field of Classification Search
CPC ............... B23K 26/53; B23K 26/0006; B23K 26/04–046; B23K 26/064; B23K 26/048;
(Continued)

(56) References Cited

U.S. PATENT DOCUMENTS 9,478,696 B2 * 10/2016 Tajikara ................. H01L 33/48
2007/0111481 A1 * 5/2007 Tamura ................. B23K 26/40
257/797
(Continued)

FOREIGN PATENT DOCUMENTS

CN    104508800 A    4/2015
JP    2007-000931 A    1/2007
(Continued)

OTHER PUBLICATIONS

English translation to JP 2019-54205 (Year: 2014).*
International Preliminary Report on Patentability mailed Apr. 12, 2018 for PCT/JP2016/074039.

*Primary Examiner* — Sang Y Paik
*Assistant Examiner* — Bonita Khlok
(74) *Attorney, Agent, or Firm* — Faegre Drinker Biddle & Reath LLP

(57) ABSTRACT

A laser processing method includes: a first step of converging laser light having a wavelength larger than 1064 nm on an object to be processed with a rear face of a silicon substrate as a laser light entrance surface and moving a first converging point of the laser light along a line to cut, and thereby forming a first modified region along the line to cut; and a second step of converging the laser light having a wavelength larger than 1064 nm on the object to be processed with the rear face as the laser light entrance surface (Continued)

after the first step and moving a second converging point of the laser light along the line to cut while offsetting the second converging point with respect to a position where the first converging point is aligned, and there by forming a second modified region along the line to cut.

5 Claims, 27 Drawing Sheets

(51) Int. Cl.
  *B23K 26/04* (2014.01)
  *B23K 26/0622* (2014.01)
  *B23K 26/53* (2014.01)
  *H01L 21/78* (2006.01)

(52) U.S. Cl.
  CPC ........ *B23K 26/048* (2013.01); *B23K 26/0622* (2015.10); *B23K 26/08* (2013.01); *B23K 26/53* (2015.10); *H01L 21/78* (2013.01)

(58) Field of Classification Search
  CPC ...... B23K 26/0622; B23K 26/08–0821; B23K 26/0869; B23K 26/50–57
  USPC ............ 219/121.72, 121.66, 121.67, 121.73, 219/121.78, 121.79; 438/463
  See application file for complete search history.

(56) References Cited

U.S. PATENT DOCUMENTS

| | | | | |
|---|---|---|---|---|
| 2008/0003708 | A1* | 1/2008 | Hoshino | B23K 26/40 |
| | | | | 438/33 |
| 2008/0096368 | A1 | 4/2008 | Sakai | |
| 2011/0300691 | A1* | 12/2011 | Sakamoto | B23K 26/53 |
| | | | | 257/E21.599 |
| 2012/0103948 | A1* | 5/2012 | Sugiura | B23K 26/40 |
| | | | | 219/121.62 |
| 2015/0207297 | A1* | 7/2015 | Fukaya | H01S 5/18 |
| | | | | 257/99 |
| 2015/0221816 | A1* | 8/2015 | Tajikara | H01L 33/48 |
| | | | | 438/33 |

FOREIGN PATENT DOCUMENTS

| | | | |
|---|---|---|---|
| JP | 2008-016486 A | | 1/2008 |
| JP | 2009-124077 A | | 6/2009 |
| JP | 2013-058534 A | | 3/2013 |
| JP | 2013-89714 A | | 5/2013 |
| JP | 2013-214601 A | | 10/2013 |
| JP | 2014-78556 A | | 5/2014 |
| JP | 2019-54205 | * | 9/2014 |
| JP | 2015-138815 A | | 7/2015 |
| JP | 2015-165532 A | | 9/2015 |
| JP | 2016-54205 A | | 4/2016 |
| KR | 10-2011-0124207 | | 11/2011 |
| WO | WO-03/077295 A1 | | 9/2003 |
| WO | WO 2010/090111 A1 | | 8/2010 |
| WO | WO-2014/030519 A1 | | 2/2014 |

* cited by examiner

Fig.7
(a)
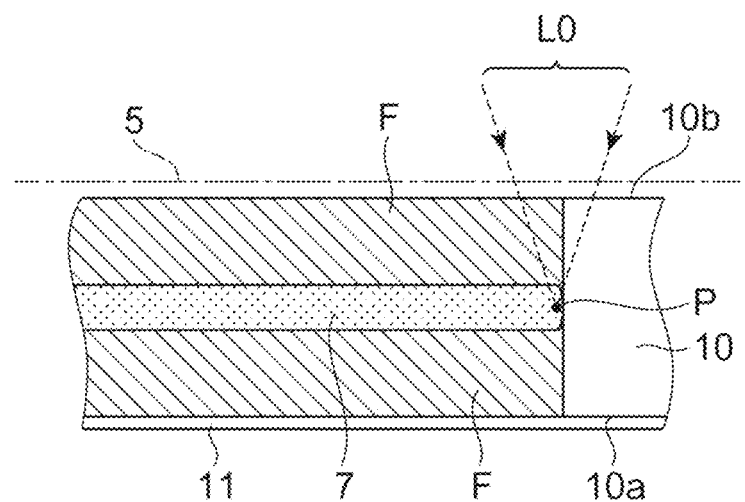
(b)
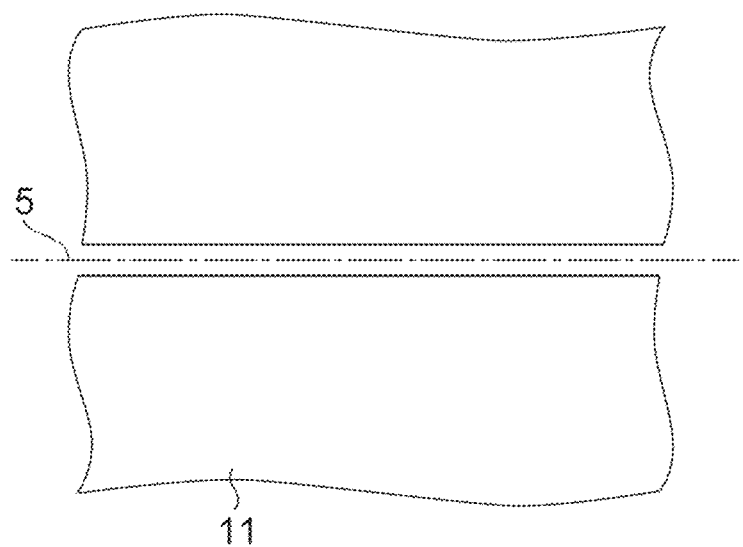

*Fig.8*
(a)
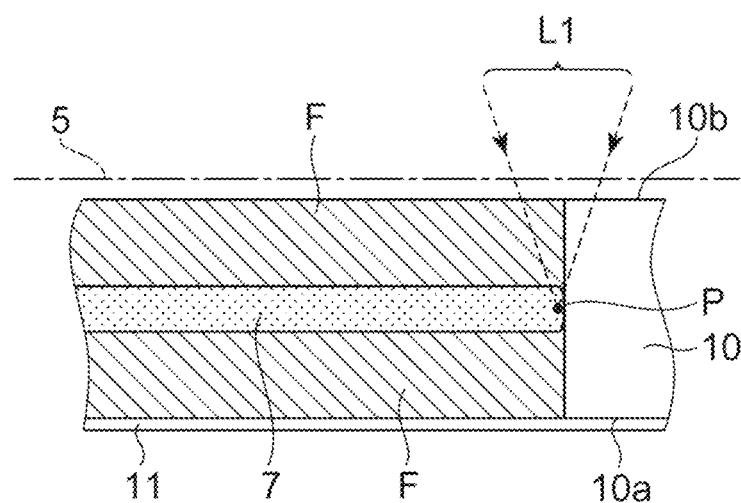
(b)
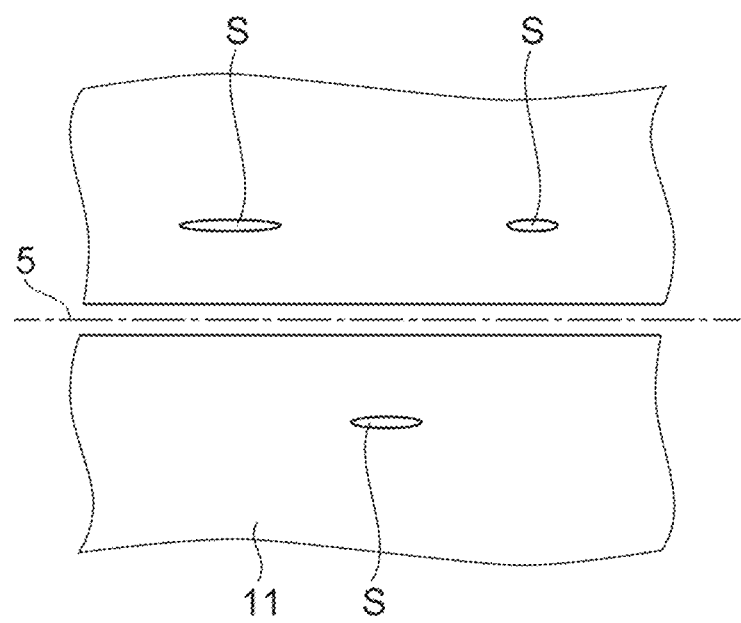

Fig.9
(a)
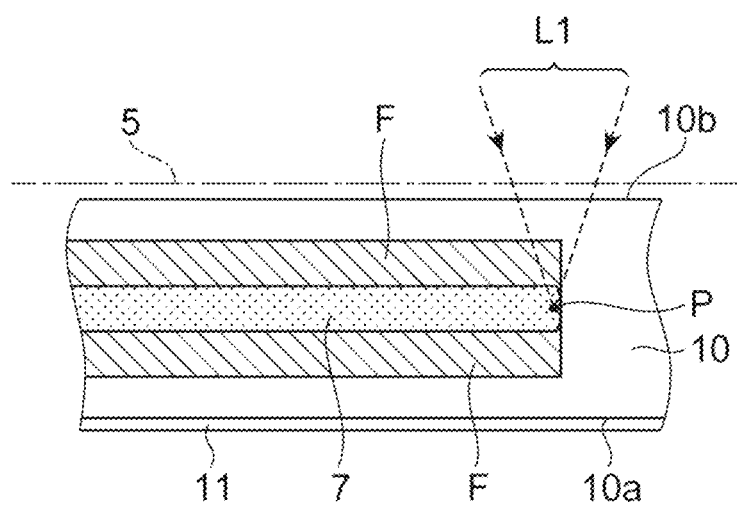
(b)
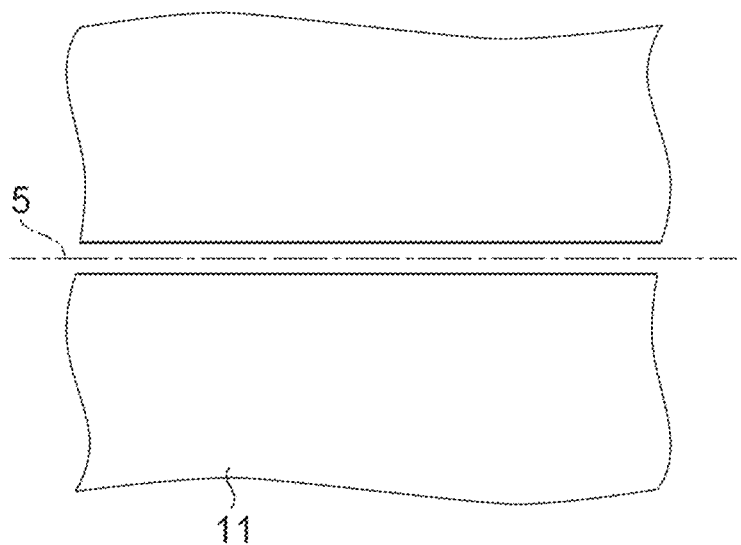

Fig.10
(a)
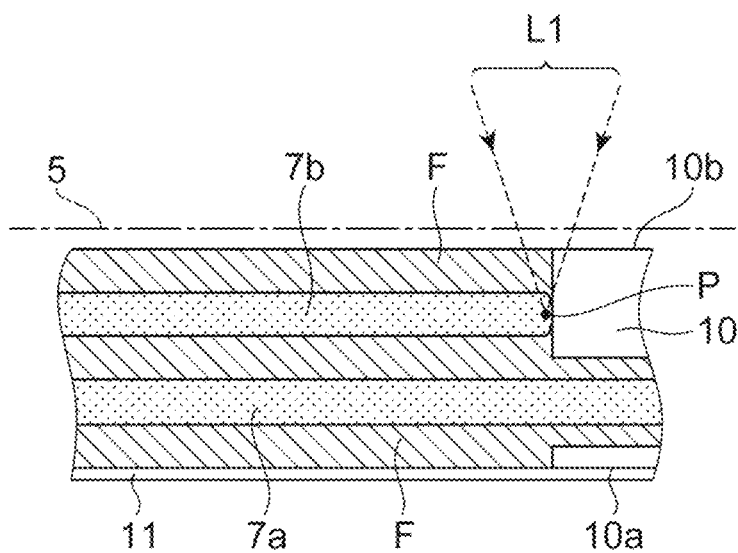
(b)
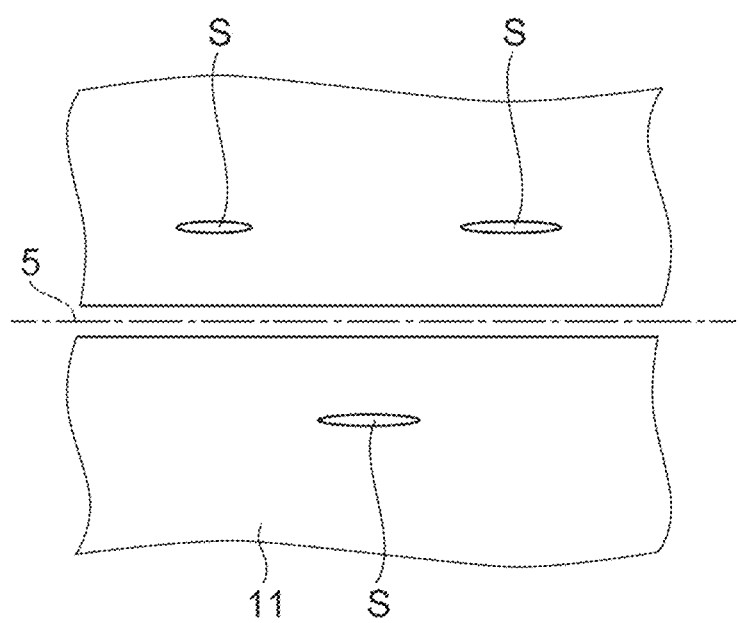

Fig.11
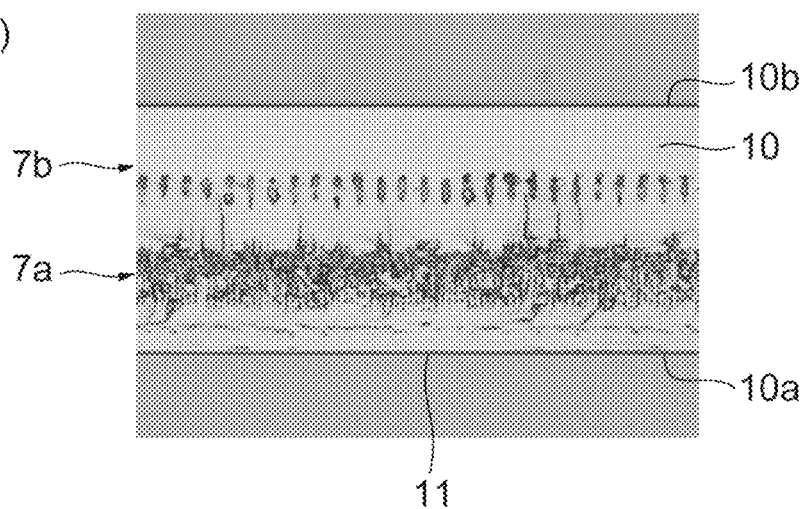
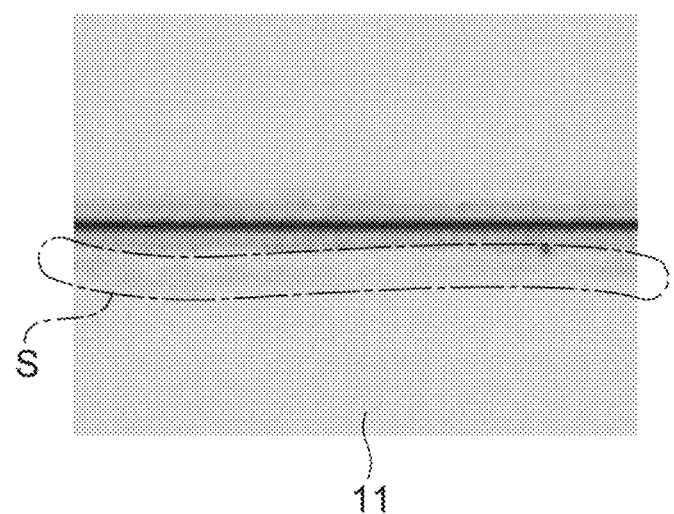

Fig.16
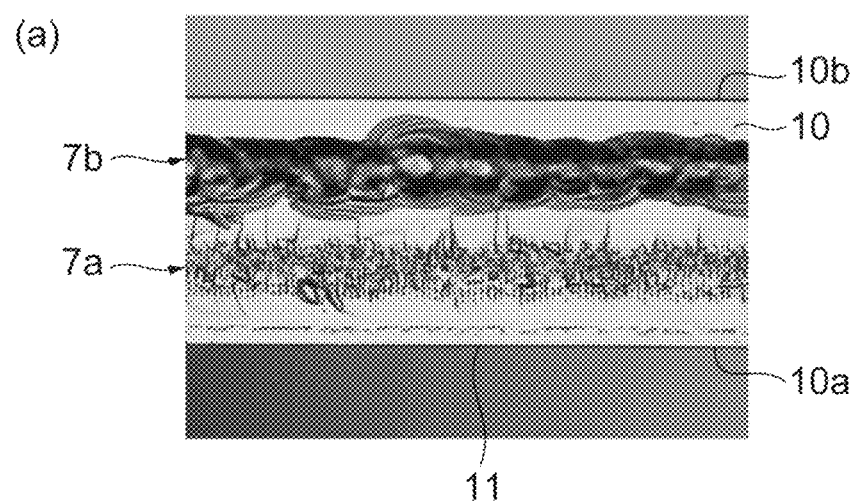
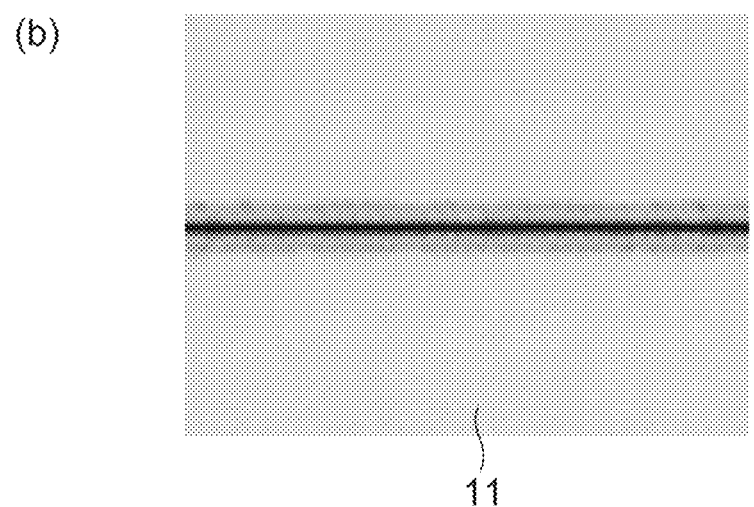

LASER PROCESSING METHOD, AND LASER PROCESSING DEVICE

TECHNICAL FIELD

The present disclosure relates to a laser processing method and a laser processing device.

BACKGROUND ART

There has been known a laser processing method of forming a modified region in the vicinity of a front face of a silicon substrate along a line to cut which is set in a lattice shape so as to pass between adjacent functional devices, by irradiating an object to be processed including the silicon substrate having a plurality of functional devices formed in a matrix on a front face thereof with laser light with a rear face of the silicon substrate as a laser light entrance surface, and then, polishing the rear face of the silicon substrate such that the silicon substrate has a predetermined thickness to cut the object to be processed for each of the functional devices (for example, see Patent Literature 1).

CITATION LIST

Patent Literature

Patent Literature 1: PCT International Application Publication No. 03/077295

SUMMARY OF INVENTION

Technical Problem

In the laser processing method as described above, it is important to reduce the number of scans of the laser light with respect to one line to cut (that is, the number of formation rows of the modified region with respect to one line to cut) from the viewpoint of improving processing efficiency. Thus, there is a case where a crack is greatly extended from the modified region in a thickness direction of the silicon substrate along with the formation of the modified region by converging the laser light having a high transmittance with respect to silicon on the silicon substrate. However, when the laser light having a high transmittance with respect to silicon is converged on the silicon substrate, damage may occur on the front face of the silicon substrate on a side opposite to the laser light entrance surface and characteristics of the functional devices may be degraded in some cases.

Therefore, an aspect of the present disclosure aims to provide a laser processing method and a laser processing device capable of improving processing efficiency while suppressing generation of damage on a front face of an object to be processed on a side opposite to a laser light entrance surface.

Solution to Problem

A laser processing method according to one aspect of the present disclosure includes: a first step of converging laser light having a wavelength larger than 1064 nm on an object to be processed including a silicon substrate having a plurality of functional devices formed on a front face thereof with a rear face of the silicon substrate as a laser light entrance surface and moving a first converging point of the laser light along a line to cut which is set so as to pass between adjacent functional devices while maintaining a distance between the front face of the silicon substrate and the first converging point of the laser light to be a first distance and thereby forming a first modified region along a line to cut; and a second step of converging the laser light having a wavelength larger than 1064 nm on the object to be processed with the rear face of the silicon substrate as the laser light entrance surface after the first step and moving a second converging point of the laser light along the line to cut while maintaining a distance between the front face of the silicon substrate and the second converging point of the laser light to be a second distance longer than the first distance and offsetting the second converging point of the laser light in a direction perpendicular to both a thickness direction of the silicon substrate and an extending direction of the line to cut with respect to a position where the first converging point of the laser light is aligned, and thereby forming a second modified region along the line to cut.

In this laser processing method, the laser light having a wavelength larger than 1064 nm is used. As a result, it is possible to greatly extend the crack in the thickness direction of the silicon substrate from the first modified region and the second modified region along with the formation of the first modified region and the second modified region as compared with the case of using laser light having a wavelength of 1064 nm or smaller. Further, in the second step, the second converging point of the laser light is offset in the direction perpendicular to both the thickness direction of the silicon substrate and the extending direction of the line to cut with respect to the position where the first converging point of the laser light is aligned. As a result, it is possible to suppress the generation of damage on the front face of the object to be processed on the side opposite to the laser light entrance surface. Accordingly, it is possible to improve the processing efficiency while suppressing the generation of damage on the front face of the object to be processed on the side opposite to the laser light entrance surface according to this laser processing method.

In the laser processing method according to one aspect of the present disclosure, the laser light may have a wavelength of 1099 μm or larger and 1342 μm or smaller. In this case, it is possible to more greatly extend the crack in the thickness direction of the silicon substrate from the first modified region and the second modified region along with the formation of the first modified region and the second modified region.

In the laser processing method according to one aspect of the present disclosure, a distance by which the second converging point of the laser light is offset in the direction perpendicular to both the thickness direction of the silicon substrate and the extending direction of the line to cut with respect to the position where the first converging point of the laser light is aligned may be 24 μm or shorter. In this case, it is possible to reliably connect the crack between the first modified region and the second modified region and to reliably extend the crack in the thickness direction of the silicon substrate from the first modified region and the second modified region along with the formation of the first modified region and the second modified region.

In the laser processing method according to one aspect of the present disclosure, a distance by which the second converging point of the laser light is offset in the direction perpendicular to both the thickness direction of the silicon substrate and the extending direction of the line to cut with respect to the position where the first converging point of the laser light is aligned may be 4 μm or larger and 18 μm or shorter. In this case, it is possible to more reliably connect the crack between the first modified region and the second modified region and to more reliably extend the crack in the thickness direction of the silicon substrate from the first modified region and the second modified region along with the formation of the first modified region and the second modified region.

In the laser processing method according to one aspect of the present disclosure, the first converging point of the laser light may be moved along the line to cut in the first step while maintaining a distance by which the first converging point of the laser light is offset in the direction perpendicular to both the thickness direction of the silicon substrate and the extending direction of the line to cut with respect to the line to cut to be zero. In this case, it is possible to make the crack extending from the first modified region to the front face side of the silicon substrate be aligned on the line to cut.

A laser processing device according to one aspect of the present disclosure includes: a support table configured to support an object to be processed including a silicon substrate having a plurality of functional devices formed on a front face thereof; a laser light source configured to emit laser light having a wavelength larger than 1064 nm; a condenser optical system configured to converge the laser light emitted from the laser light source on the object to be processed which is supported by the support table such that a rear face of the silicon substrate becomes a laser light entrance surface; and a control unit configured to control an operation of at least one of the support table, the laser light source, and the condenser optical system. The control unit moves a first converging point of the laser light along a line to cut which is set so as to pass between adjacent functional devices while maintaining a distance between the front face of the silicon substrate and the first converging point of the laser light to be a first distance, and then, moves a second converging point of the laser light along the line to cut while maintaining a distance between the front face of the silicon substrate and the second converging point of the laser light to be a second distance, longer than the first distance, and offsetting the second converging point of the laser light in a direction perpendicular to both a thickness direction of the silicon substrate and an extending direction of the line to cut with respect to a position where the first converging point of the laser light is aligned.

According to this laser processing device, it is possible to improve the processing efficiency while suppressing the generation of damage on the front face of the object to be processed on the side opposite to the laser light entrance surface for the same reason as the laser processing method described above.

Advantageous Effects of Invention

According to one aspect of the present disclosure, it is possible to provide the laser processing method and the laser processing device capable of improving the processing efficiency while suppressing the generation of damage on the front face of the object to be processed on the side opposite to the laser light entrance surface.

BRIEF DESCRIPTION OF DRAWINGS

FIG. 7(a) is a cross-sectional view taken along a line to cut of the object to be processed during laser processing. FIG. 7(b) is a plan view of the object to be processed after cutting.

FIG. 8(a) is a cross-sectional view taken along the line to cut of the object to be processed during laser processing. FIG. 8(b) is a plan view of the object to be processed after cutting.

FIG. 9(a) is a cross-sectional view taken along the line to cut of the object to be processed during laser processing. FIG. 9(b) is a plan view of the object to be processed after cutting.

FIG. 10(a) is a cross-sectional view taken along the line to cut of the object to be processed during laser processing. FIG. 10(b) is a plan view of the object to be processed after cutting.

FIG. 11(a) is a view illustrating a photograph of a plane parallel to a line to cut of a silicon substrate after cutting. FIG. 11(b) is a view illustrating a photograph of a front face side of the silicon substrate after cutting.

FIG. 16(a) is a view illustrating a photograph of a plane parallel to a line to cut of the silicon substrate after cutting. FIG. 16(b) is a view illustrating a photograph of the front face side of the silicon substrate after cutting.

DESCRIPTION OF EMBODIMENTS

Figure 1:
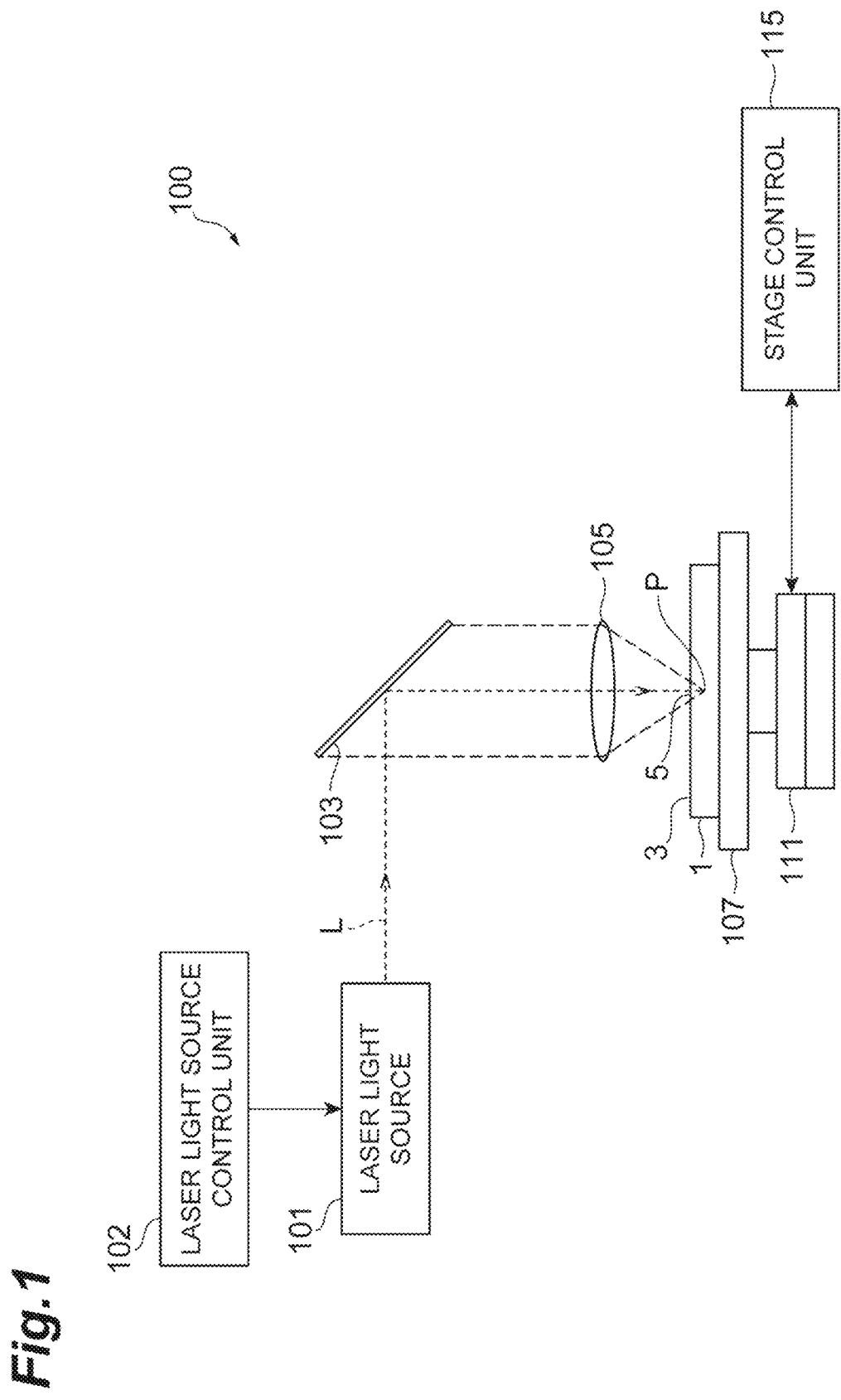
FIG. 1 is a schematic configuration diagram of a laser processing device used for forming a modified region.

Hereinafter, an embodiment of the present disclosure will be described in detail with reference to the drawings. Incidentally, the same or equivalent parts will be denoted by the same reference numerals in the respective drawings, and overlapping descriptions thereof will be omitted.

In a laser processing method and a laser processing device according to the embodiment, a modified region is formed in an object to be processed along a line to cut by converging laser light on the object to be processed. First, the formation of the modified region will be described with reference to FIGS. 1 to 6.

As illustrated in FIG. 1, a laser processing device 100 includes a laser light source 101 configured to oscillate laser light L in a pulsating manner, a dichroic mirror 103 arranged to change a direction of an optical axis (optical path) of the laser light L by 90°, and a condenser lens 105 configured to converge the laser light L. In addition, the laser processing device 100 includes a support table 107 configured to support an object to be processed 1, irradiated with the laser light L converged by the condenser lens 105, a stage 111 configured to move the support table 107, a laser light source control unit 102 configured to control the laser light source 101 to adjust an output, a pulse width, a pulse waveform, and the like of the laser light L, and a stage control unit 115 configured to control the movement of the stage 111.

In the laser processing device 100, the direction of the optical axis of the laser light L emitted from the laser light source 101 is changed by 90° by the dichroic mirror 103, and then, the laser light L is converged by the condenser lens 105 into the object to be processed 1 mounted on the support table 107. At the same time, the stage 111 is moved, and the object to be processed 1 is moved relative to the laser light L along a line to cut 5. As a result, the modified region along the line to cut 5 is formed in the object to be processed 1. Although the stage 111 is moved to relatively move the laser light L here, the condenser lens 105 may be moved, or both the stage 111 and the condenser lens 105 may be moved.

Figure 2:
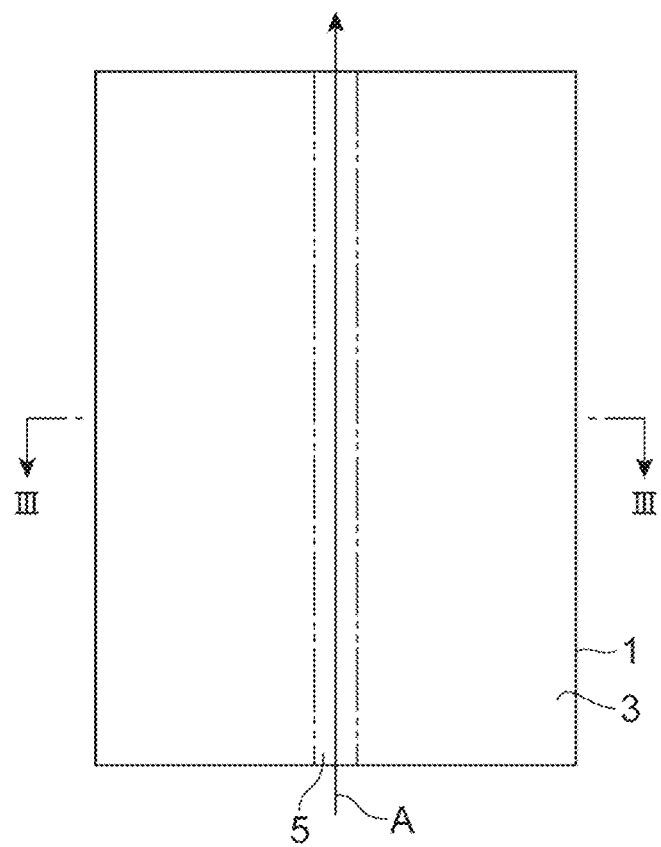
FIG. 2 is a plan view of an object to be processed to which the modified region is formed.
Figure 3:
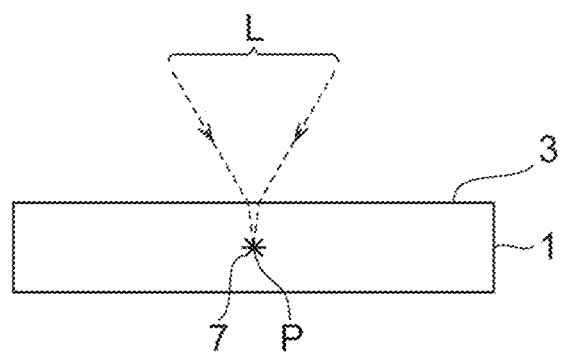
FIG. 3 is a cross-sectional view taken along the line III-III of the object to be processed of FIG. 2.
Figure 4:
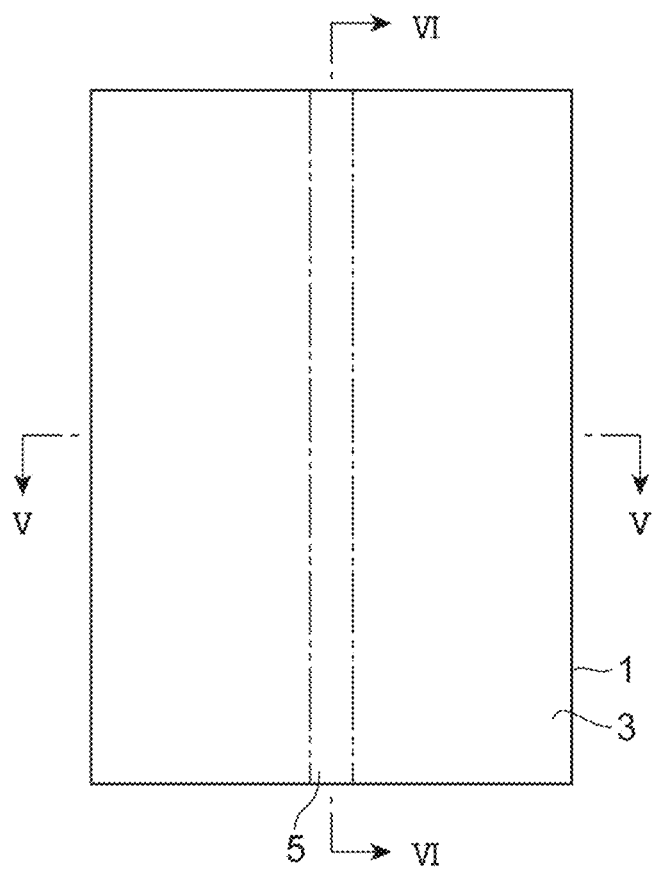
FIG. 4 is a plan view of the object to be processed after laser processing.
Figure 5:
FIG. 5 is a cross-sectional view taken along the line V-V of the object to be processed of FIG. 4.
Figure 6:
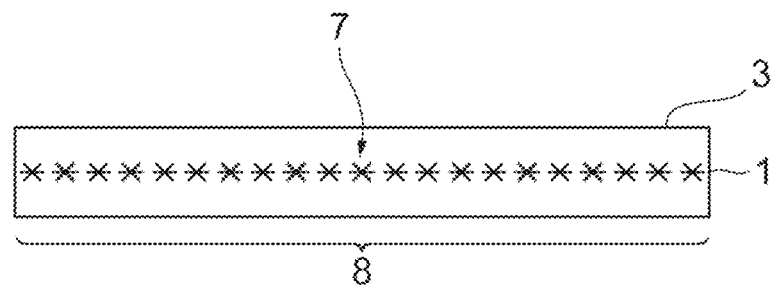
FIG. 6 is a cross-sectional view taken along the line VI-VI of the object to be processed of FIG. 4.

A plate-like member (for example, a substrate, a wafer, or the like) including a semiconductor substrate formed using a semiconductor material, a piezoelectric substrate formed using a piezoelectric material, or the like is used as the object to be processed 1. As illustrated in FIG. 2, the line to cut 5 for cutting of the object to be processed 1 is set in the object to be processed 1. The line to cut 5 is a virtual line extending straight. In the case of forming the modified region inside the object to be processed 1, the laser light L is relatively moved along the line to cut 5 (that is, in a direction indicated by an arrow A in FIG. 2) in a state where a converging point (converging position) P is set inside the object to be processed 1 as illustrated in FIG. 3. As a result, a modified region 7 is formed on the object to be processed 1 along the line to cut 5, and the modified region 7 formed along the line to cut 5 becomes a cutting start region 8 as illustrated in FIGS. 4, 5 and 6.

The converging point P is a point at which the laser light L is converged. The line to cut 5 is not limited to a linear shape, but may be a curved shape, may be a three-dimensional shape in which both the linear shape and the curved shape are combined, or maybe a coordinate-designated line. The line to cut 5 is not limited to the virtual line but may be a line actually drawn on a front face 3 of the object to be processed 1. The modified region 7 is formed either continuously or intermittently. The modified region 7 may be formed either in rows or dots, and it is only necessary for the modified region 7 to be formed at least inside the object to be processed 1. In addition, there is a case where cracks are formed from the modified region 7 as a start point, and the cracks and the modified region 7 may be exposed on an outer surface (the front face 3, a rear face, or an outer peripheral surface) of the object to be processed 1. A laser light entrance surface at the time of forming the modified region 7 is not limited to the front face 3 of the object to be processed 1, but may be the rear face of the object to be processed 1.

Incidentally, when the modified region 7 is formed inside the object to be processed 1, the laser light L passes through the object to be processed 1 and is particularly absorbed in the vicinity of the converging point P positioned inside the object to be processed 1. As a result, the modified region 7 is formed in the object to be processed 1 (that is, internal absorption type laser processing). In this case, the laser light L is hardly absorbed on the front face 3 of the object to be processed 1, and thus, the front face 3 of the object to be processed 1 does not melt. On the other hand, when the modified region 7 is formed on the front face 3 of the object to be processed 1, the laser light L is particularly absorbed in the vicinity of the converging point P positioned on the front face 3 so that the front face 3 melts and is removed to form a removed portion such as a hole and a groove (surface absorption type laser processing).

The modified region 7 indicates a region in which a density, a refractive index, mechanical strength, and other physical characteristics have attained states different from those of the surroundings. Examples of the modified region 7 include molten processed regions (which means at least any one of a region resolidified after melting, a region in a melted state, and a region in the state of being resolidified from the melted state), a crack region, a dielectric breakdown region, a refractive index changed region, and a mixed region thereof. Further, there are a region where the density of the modified region 7 has changed from that of an unmodified region and a region formed with a lattice defect in a material of the object to be processed 1 as the modified region 7. When the material of the object to be processed 1 is monocrystalline silicon, the modified region 7 can also be referred to as a high dislocation density region.

The molten processed region, the refractive index changed region, the region where the modified region 7 has a density different from that of the unmodified region, and the region formed with the lattice defect further incorporate cracks (fissures or microcracks) inside these regions or at an interface between the modified region 7 and the unmodified region in some cases. The incorporated crack is forming either over the whole surface of the modified region 7 or in only a part or a plurality of parts thereof. The object to be processed 1 includes a substrate made of a crystalline material having a crystal structure. For example, the object to be processed 1 includes a substrate formed using at least one of gallium nitride (GaN), silicon (Si), silicon carbide (SiC), $LiTaO_3$, and sapphire ($Al_2O_3$). In other words, the object to be processed 1 includes, for example, a gallium nitride substrate, a silicon substrate, a SiC substrate, a $LiTaO_3$ substrate, or a sapphire substrate. The crystal material may be either an anisotropic crystal or an isotropic crystal. In addition, the object to be processed 1 may include a substrate made of a non-crystalline material having a non-crystalline structure (amorphous structure), and may include a glass substrate, for example.

In the embodiment, the modified region 7 can be formed by forming a plurality of modified spots (processing scars) along the line to cut 5. In this case, the plurality of modified spots gather to form the modified region 7. The modified spot is a modified part formed by a shot of one pulse of pulsed laser light (that is, one pulse of laser irradiation; a laser shot). Examples of the modified spot include a crack spot, a molten processed spot, a refractive index changed spot, or a mixture of at least one of these spots. A size of the modified spot and a length of the crack thus generated are controlled as appropriate in consideration of required cutting accuracy, required flatness of cut surfaces, a thickness, a kind, and a crystal orientation of the object to be processed 1, and the like. In addition, the modified spot can be formed as the modified region 7 along the line to cut 5 in the embodiment.

Next, a verification result on a splash will be described. Incidentally, "damage generated on a front face of an object to be processed on a side opposite to a laser light entrance surface when the laser processing as described above is performed targeting the object to be processed including a silicon substrate" will be referred to as the "splash".

As illustrated in FIGS. 7 to 10, one having a metal film 11 formed on a front face 10a of a silicon substrate 10 was prepared as the object to be processed. The metal film 11 is configured by forming a Cr film having a thickness of 20 μm as a base on the front face 10a of the silicon substrate 10 and forming an Au film having a thickness of 50 on the Cr film.

As illustrated in FIG. 7(a), laser light L0 having a wavelength of 1064 nm is converged inside the silicon substrate 10 with a rear face 10b of the silicon substrate 10 as the laser light entrance surface to move a converging point P of the laser light L0 along the line to cut 5, thereby forming the modified region 7 inside the silicon substrate 10 along the line to cut 5. At this time, an irradiation condition of the laser light L0 was adjusted such that a crack F extending in a thickness direction of the silicon substrate 10 from the modified region 7 along with the formation of the modified region 7 (that is, the crack F generated accompanying the formation of the modified region 7 without applying an external force to the silicon substrate 10) reaches the front face 10a of the silicon substrate 10. In this case, no splash was generated in the metal film 11 as illustrated in FIG. 7(b).

As illustrated in FIG. 8(a), laser light L1 having a wavelength of 1342 nm is converged inside the silicon substrate 10 with the rear face 10b of the silicon substrate 10 as the laser light entrance surface to move a converging point P of the laser light L1 along the line to cut 5, thereby forming the modified region 7 inside the silicon substrate 10 along the line to cut 5. At this time, an irradiation condition of the laser light L1 was adjusted such that the crack F extending from the modified region 7 reaches the front face 10a of the silicon substrate 10. Specifically, the irradiation condition of the laser light L1 is set to be the same as the above-described irradiation condition of the laser light L0 except that the wavelengths are different. In this case, a splash S was generated in the metal film 11 as illustrated in FIG. 8(b).

As illustrated in FIG. 9(a), the laser light L1 having the wavelength of 1342 nm is converged inside the silicon substrate 10 with the rear face 10b of the silicon substrate 10 as the laser light entrance surface to move the converging point P of the laser light L1 along the line to cut 5, thereby forming the modified region 7 inside the silicon substrate 10 along the line to cut 5. At this time, the irradiation condition of the laser light L1 was adjusted such that the crack F extending from the modified region 7 does not reach the front face 10a of the silicon substrate 10 but settles inside the silicon substrate 10. Specifically, pulse energy of the laser light L1 was made smaller than that in the case of FIGS. 8(a) and 8(b). In this case, no splash was generated in the metal film 11 as illustrated in FIG. 9(b).

As illustrated in FIG. 10(a), laser light L1 having a wavelength of 1342 nm is converged inside the silicon substrate 10 with the rear face 10b of the silicon substrate 10 as the laser light entrance surface to move a converging point P of the laser light L1 along the line to cut 5, thereby forming a first modified region 7a and a second modified region 7b inside the silicon substrate 10 along the line to cut 5. At this time, the irradiation condition of the laser light L1 was adjusted such that the crack F does not reach the front face 10a of the silicon substrate 10 only by forming the first modified region 7a, and the crack F reaches the front face 10a of the silicon substrate 10 when the second modified region 7b is formed on the rear face 10b side of the silicon substrate 10 with respect to the first modified region 7a. In this case, the splash S is generated in the metal film 11 as illustrated in FIG. 10(b).

FIGS. 11(a) and 11(b) are views illustrating photographs of the silicon substrate 10 when the first modified region 7a and the second modified region 7b are formed inside the silicon substrate 10 under the condition of FIGS. 10(a) and 10(b). More specifically, FIG. 11(a) is the view illustrating the photograph of a plane parallel to the line to cut of the silicon substrate 10 after cutting, and FIG. 11(b) is the view illustrating the photograph of the front face 10a side (the metal film 11) of the silicon substrate 10 after cutting. Referring to FIG. 11(b), it is possible to confirm that a dark part exists in an area surrounded by the one-dot chain line in the metal film 11. This dark part is the splash S which is problematic.

When the laser light L1 having a wavelength larger than 1064 nm, such as 1342 nm, is used, it is possible to greatly extend the crack F in the thickness direction of the silicon substrate 10 from the modified region 7 as compared with the case of using the laser light L0 having a wavelength of 1064 nm or smaller. In addition, when the laser light L1 having wavelength larger than 1064 nm, such as 1342 nm, is used, it is possible to form the modified region 7 at a deeper position from the laser light entrance surface of the silicon substrate 10 as compared with the case of using the laser light L0 having a wavelength of 1064 nm or smaller. These effects result from a fact that the laser light L1 having a wavelength larger than 1064 nm has a higher transmittance with respect to silicon than the laser light L0 having a wavelength of 1064 nm or smaller. Therefore, the laser light L1 having a wavelength larger than 1064 nm may be used from the viewpoint of improving processing efficiency by reducing the number of scans of the laser light L with respect to one line to cut 5 (that is, the number of formation rows of the modified region 7 with respect to one line to cut 5).

However, the splash S is generated in the metal film 11 when the laser light L1 having a wavelength larger than 1064 nm is used to make the crack F reach the front face 10a of the silicon substrate 10 as in the above-described cases of FIGS. 8(a) and 8(b) and FIGS. 10(a) and 10(b). If the splash S is generated in a case where a functional device (for example, a semiconductor operating layer formed by crystal growth, a light receiving element such as a photodiode, a light emitting element such as a laser diode, a circuit element formed as a circuit, or the like) is formed on the front face 10a of the silicon substrate 10 on the side opposite to the laser light entrance surface, there is a risk that characteristics of the functional device may be degraded.

Therefore, there is a technically great significance if it is possible to suppress the generation of the splash S in the case of using the laser light L1 having a wavelength larger than 1064 nm to make the crack F reach the front face 10a of the silicon substrate 10.

The present inventors have conceived that the generation of the splash S on the front face 10a of the silicon substrate 10 results from an increase of influence of escaping light (light, which escapes to the front face 10a side of the silicon substrate 10 without contributing to the formation of the modified region 7, of the laser light L1) as the laser light L1 is converged on the crack F that has largely extended from the already formed modified region 7 when laser light L1 having a wavelength larger than 1064 nm is used. Based on such findings, the present inventors have conceived that it is possible to reduce the influence of the escaping light, which causes the generation of the splash S, if the converging point P of the laser light L1 is offset at the time of forming the second modified region 7b in the case of FIGS. 10(a) and 10(b), and have conducted the following verification. Incidentally, at the time of forming the second modified region 7b, "to offset the converging point P of the laser light L1 in a direction perpendicular to both the thickness direction of the silicon substrate 10 and an extending direction of the line to cut 5 (a direction perpendicular to a cross section of the silicon substrate 10 in FIG. 10(a)) with respect to a position where the converging point P of the laser light L1 is aligned when forming the first modified region 7a" will be simply referred to as "to offset the converging point P of the laser light L1", and a "distance by which the converging point P of the laser light L1 is offset" will be referred to as an "offset amount".

Figure 12:
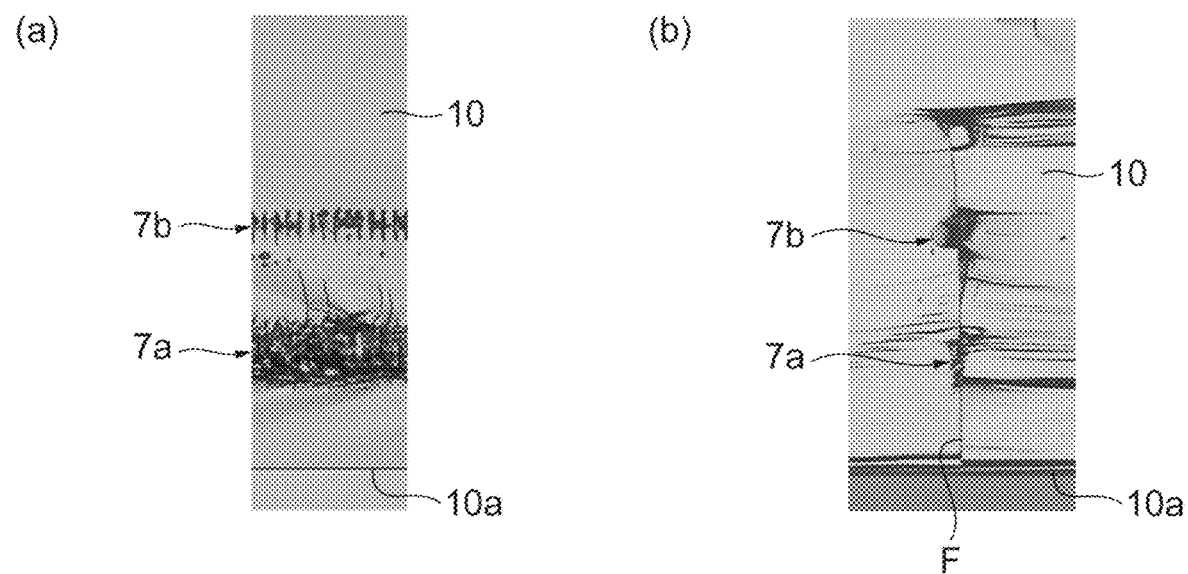
FIG. 12(a) is a view illustrating a photograph of a plane parallel to the line to cut of the silicon substrate after formation of a first modified region and a second modified region.
FIG. 12(b) is a view illustrating a photograph of a plane perpendicular to the line to cut of the silicon substrate after formation of the first modified region and the second modified region.

First, a direction of the crack F extending from the first modified region 7a to the front face 10a side of the silicon substrate 10 was verified. FIGS. 12(a) and 12(b) are views illustrating photographs of the silicon substrate 10 in the case of not offsetting the converging point P of the laser light L1 at the time of forming the second modified region 7b. More specifically, FIG. 12(a) is the view illustrating the photograph of a plane parallel to the line to cut of the silicon substrate 10 after forming the first modified region 7a and the second modified region 7b, and FIG. 12(b) is the view illustrating the photograph of a plane perpendicular to the line to cut of the silicon substrate 10 after forming the first modified region 7a and the second modified region 7b. Referring to FIG. 12(b), it is possible to confirm that the crack F extends straight (along the thickness direction of the silicon substrate 10) from the first modified region 7a to the front face 10a side of the silicon substrate 10 in the case of not offsetting the converging point P of the laser light L1 at the time of forming the second modified region 7b.

Figure 13:
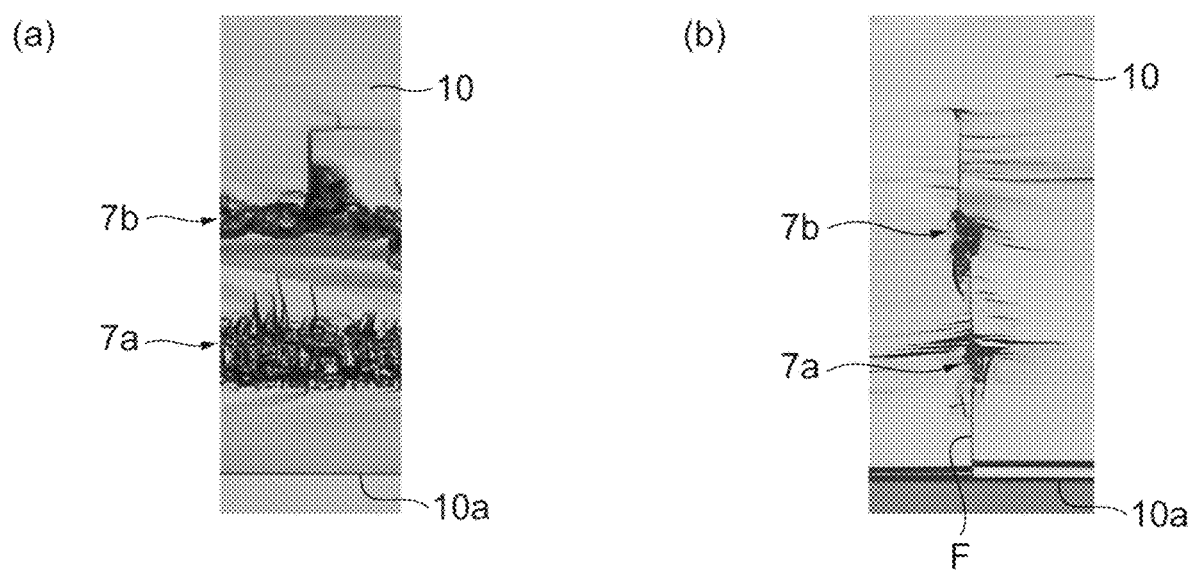
FIG. 13(a) is a view illustrating a photograph of a plane parallel to the line to cut of the silicon substrate after formation of the first modified region and the second modified region.
FIG. 13(b) is a view illustrating a photograph of a plane perpendicular to the line to cut of the silicon substrate after formation of the first modified region and the second modified region.

FIGS. 13(a) and 13(b) are views illustrating photographs of the silicon substrate 10 in the case of offsetting the converging point P of the laser light L1 (case of the offset amount of 8 μm) at the time of forming the second modified region 7b. More specifically, FIG. 13(a) is the view illustrating the photograph of a plane parallel to the line to cut of the silicon substrate 10 after forming the first modified region 7a and the second modified region 7b, and FIG. 13(b) is the view illustrating the photograph of a plane perpendicular to the line to cut of the silicon substrate 10 after forming the first modified region 7a and the second modified region 7b. Referring to FIG. 13(b), it is possible to confirm that the crack F extends straight (along the thickness direction of the silicon substrate 10) from the first modified region 7a to the front face 10a side of the silicon substrate 10 even in the case of offsetting the converging point P of the laser light L1 at the time of forming the second modified region 7b.

Figure 14:
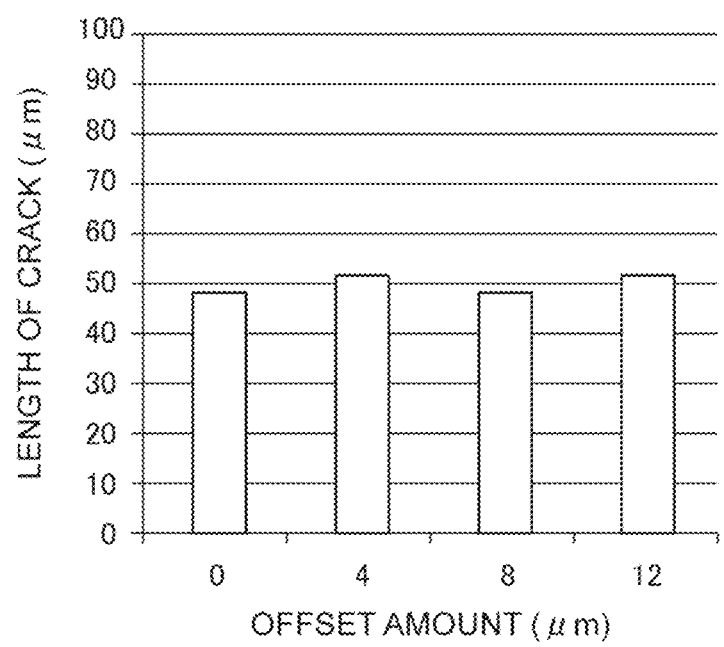
FIG. 14 is a graph illustrating a relationship between an offset amount and a length of a crack.

Subsequently, a length of the crack F extending from the first modified region 7a to the front face 10a side of the silicon substrate 10 was verified. FIG. 14 is a graph illustrating a relationship between the offset amount and the length of the crack F. The length of the crack F is the length of the crack F extending from the first modified region 7a to the front face 10a side of the silicon substrate 10. Referring to FIG. 14, it is possible to confirm that the length of the crack F extending from the first modified region 7a to the front face 10a side of the silicon substrate 10 does not change either in the case of offsetting or in the case of not offsetting (the case of the offset amount of 0 μm) the converging point P of the laser light L1 at the time of forming the second modified region 7b.

Figure 15:
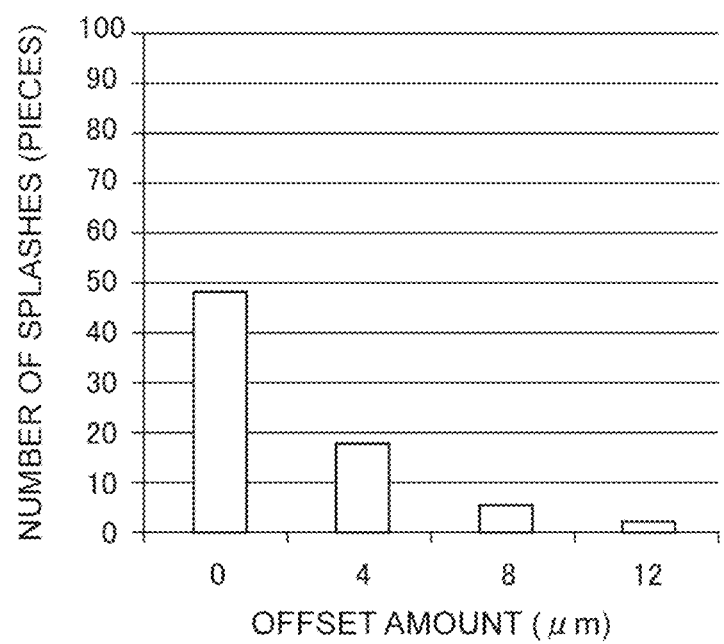
FIG. 15 is a graph illustrating a relationship between the offset amount and the number of splashes.

Subsequently, a generation amount of the splash S was verified. FIG. 15 is a graph illustrating a relationship between the offset amount and the number of splashes S. The number of splashes S is the number of splashes S (the number per length of 15 mm of the line to cut 5) generated in regions which are 20 μm or more away from both sides of the line to cut 5. Referring to FIG. 15, it is possible to confirm that the number of splashes S decreases in the case of offsetting the converging point P of the laser light L1 at the time of forming the second modified region 7b as compared with the case of not offsetting (in the case of the offset amount of 0 μm) the converging point P of the laser light L1. Incidentally, the reason why the number of the splashes S generated in the regions which are 20 μm or more away from both the sides of the line to cut 5 is counted is because particularly such splashes S cause a problem of degrading the characteristics of the functional device formed on the front face 10a of the silicon substrate 10. Since a dicing street (an area between adjacent functional devices) is often provided in regions within 20 μm from both the sides of the line to cut 5, the splash S generated in these regions is unlikely to cause the problem of degrading the characteristics of the functional device.

Based on the verification results of FIGS. 12(a) and 12(b), FIGS. 13(a) and 13(b), and FIGS. 14 and 15, it has been found that the crack F extends straight (along the thickness direction of the silicon substrate 10) from the first modified region 7a to the front face 10a side of the silicon substrate 10 and the length of the crack F extending from the first modified region 7a to the front face 10a side of the silicon substrate 10 does not change even if the converging point P of the laser light L1 is offset at the time of forming the second modified region 7b. On the other hand, it has been found that the number of splashes S decreases if the converging point P of the laser light L1 is offset at the time of forming the second modified region 7b. Incidentally, the irradiation conditions of the laser light other than the offset amount are the same in the verifications of FIGS. 12(a) and 12(b), FIGS. 13(a) and 13(b), and FIGS. 14 and 15.

The present inventors have considered as follows regarding the decrease in the number of splashes S. FIGS. 16(a) and 16(b) are views illustrating photographs of the silicon substrate 10 in the case of offsetting the converging point P of the laser light L1 at the time of forming the second modified region 7b. More specifically, FIG. 16(a) is the view illustrating the photograph of a plane parallel to the line to cut 5 of the silicon substrate 10 after cutting, and FIG. 16(b) is the view illustrating the photograph of the front face 10a side (the metal film 11) of the silicon substrate 10 after cutting. Referring to FIG. 16(a), it is possible to confirm that the second modified region 7b is formed to be large as the laser light L1 is prevented from being converged on the crack F extending from the first modified region 7a and the second modified region 7b, which have already been formed, by offsetting the converging point P of the laser light L1 at the time of forming the second modified region 7b. That is, it is considered that the proportion of the laser light L1 contributing to the formation of the second modified region 7b increases, and the proportion of the escaping light decreases. Referring to FIG. 16(b), it is possible to confirm that splash S is not generated.

On the other hand, it is possible to confirm that the second modified region 7b is formed to be small when referring to FIG. 11(a) illustrating the photograph of the silicon substrate 10 in the case of not offsetting the converging point P of the laser light L1 at the time of forming the second modified region 7b. It is considered that this is because the laser light L1 is converged on the crack F extending from the first modified region 7a and the second modified region 7b, which have already been formed, so that the amount of escaping light increases. Incidentally, the irradiation conditions of the laser light other than the offset amount are the same in the verifications of FIGS. 11(a) and 11(b) and FIGS. 16(a) and 16(b).

Figure 17:
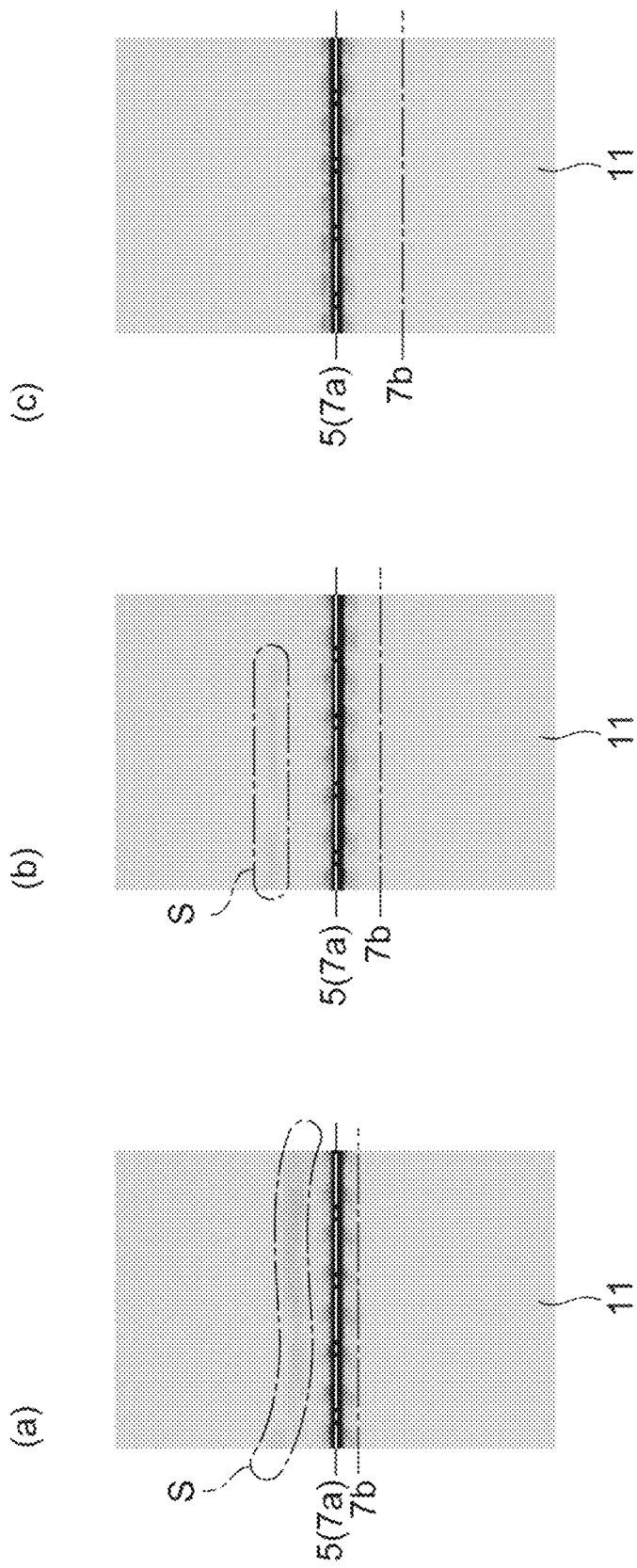
FIG. 17(a) is a view illustrating a photograph of the front face side of the silicon substrate after cutting when the offset amount is 2 μm.
FIG. 17(b) is a view illustrating a photograph of the front face side of the silicon substrate after cutting when the offset amount is 4 μm.
FIG. 17(c) is a view illustrating a photograph of the front face side of the silicon substrate after cutting when the offset amount is 6 μm.

FIGS. 17(a), 17(b), and 17(c) are views illustrating photographs of the front face 10a side (the metal film 11) of the silicon substrate 10 after cutting. More specifically, FIG. 17(a) illustrates a case where the offset amount is 2 µm, FIG. 17(b) illustrates a case where the offset amount is 4 µm, and FIG. 17(c) illustrates a case where the offset amount is 6 µm. In each case, the irradiation conditions of the laser light other than the offset amount are the same. Referring to FIGS. 17(a) and 17(b), it is possible to confirm that the splash S is generated on a side opposite to a side on which the converging point P of the laser light L1 has been offset at the time of forming the second modified region 7b, and that the splash S is farther away from the line to cut 5 as the offset amount is increased. In addition, it is possible to confirm that a generation area of the splash S decreases as the offset amount is increased when referring to FIGS. 17(a), 17(b), and 17(c). Incidentally, the generation area of the splash S also decreases in both the cases of FIGS. 17(a) and 17(b) as compared with the case of not offsetting the converging point P of the laser light L1 at the time of forming the second modified region 7b.

Figure 18:
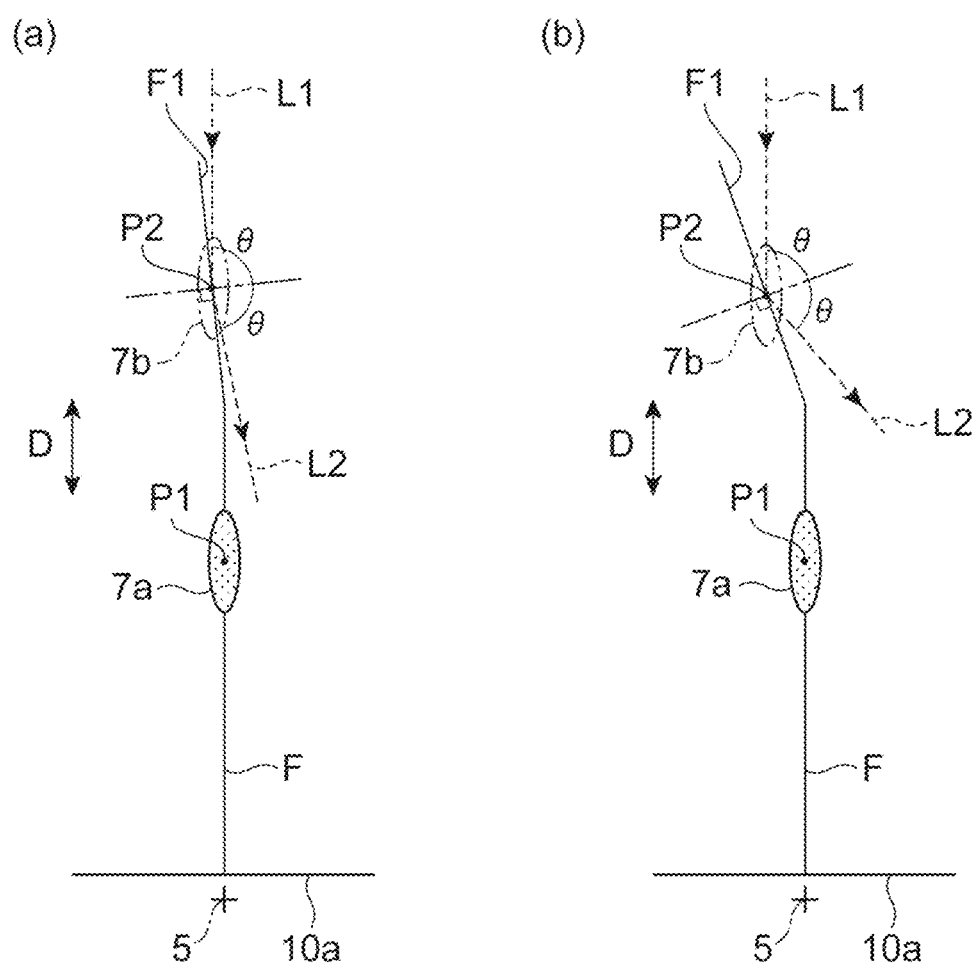
FIG. 18(a) is a view illustrating the plane perpendicular to the line to cut of the silicon substrate when the offset amount is small.
FIG. 18(b) is a view illustrating the plane perpendicular to the line to cut of the silicon substrate when the offset amount is large.

The reason why the results of FIGS. 17(a), 17(b), and 17(c) have been obtained is considered as follows. FIG. 18(a) is a view illustrating a plane perpendicular to the line to cut 5 of the silicon substrate 10 when the offset amount is small, and FIG. 18(b) is a view illustrating a plane perpendicular to the line to cut 5 of the silicon substrate 10 when the offset amount is large. Incidentally, the "converging point P of the laser light L1 at the time of forming the first modified region 7a" will be referred to as a "first converging point P1" and the "converging point P of the laser light L1 at the time of forming the second modified region 7b" will be referred to as a "second converging point P2".

When the offset amount is small as illustrated in FIG. 18(a), a portion F1 of the crack F extending from the already-formed first modified region 7a and second modified region 7b where the second converging point P2 of the laser light L1 is aligned is inclined at a small angle with respect to a thickness direction D of the silicon substrate 10. Thus, an incident angle θ of the laser light L1 with respect to the portion F1 increases. Therefore, escaping light L2, which has not contributed to the formation of the second modified region 7b, of the laser light L1 advances to a side opposite to a side where the converging point P of the laser light L1 is offset at the small angle with respect to the thickness direction D of the silicon substrate 10. As a result, an optical path length of the escaping light L2 reaching the front face 10a of the silicon substrate 10 becomes short, and an absorption amount and a scattering degree of the escaping light L2 inside the silicon substrate 10 decrease. Incidentally, "small", "large", "short", and the like are used in comparison with the case of FIG. 18(b).

On the other hand, when the offset amount is large as illustrated in FIG. 18(b), the portion F1 of the crack F extending from the already-formed first modified region 7a and second modified region 7b where the second converging point P2 of the laser light L1 is aligned is inclined at a large angle with respect to the thickness direction D of the silicon substrate 10. Thus, the incident angle θ of the laser light L1 with respect to the portion F1 decreases. Therefore, the escaping light L2, which has not contributed to the formation of the second modified region 7b, of the laser light L1 advances to the side opposite to the side where the converging point P of the laser light L1 is offset at the large angle with respect to the thickness direction D of the silicon substrate 10. As a result, an optical path length of the escaping light L2 reaching the front face 10a of the silicon substrate 10 becomes long, and an absorption amount and a scattering degree of the escaping light L2 inside the silicon substrate 10 increase. Incidentally, "large", "small", "long", and the like are used in comparison with the case of FIG. 18(a).

Based on the above consideration of FIGS. 18(a) and 18(b), it is considered that the splash S is generated on the side opposite to the side where the converging point P of the laser light L1 is offset at the time of forming the second modified region 7b, the splash S is farther away from the line to cut 5 as the offset amount increases, and the generation area of the splash S decreases as the offset amount increases.

Figure 19:
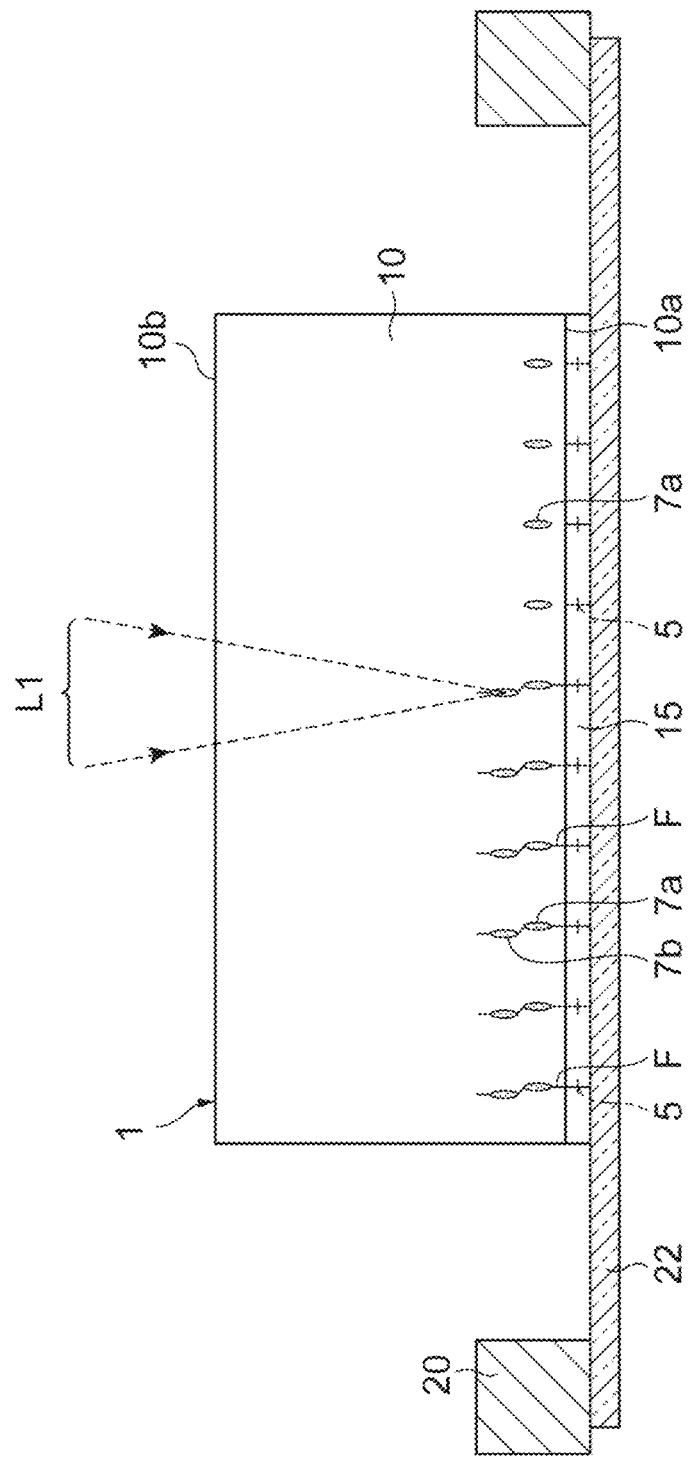
FIG. 19 is a cross-sectional view for describing a method of manufacturing a semiconductor chip using a laser processing method of an embodiment.

Next, a method of manufacturing a semiconductor chip using the laser processing method of the embodiment will be described. First, the object to be processed 1 including the silicon substrate 10 having a functional device layer 15 formed on the front face 10a is prepared, and the functional device layer 15 side of the object to be processed 1 is pasted to a protective film 22 held by a ring-shaped holding member 20 as illustrated in FIG. 19. The functional device layer 15 includes a plurality of functional devices arranged in a matrix.

Subsequently, the first modified region 7a is formed along each of the lines to cut 5 set in a lattice shape so as to pass between adjacent functional devices. More specifically, the first modified region 7a is formed along the line to cut 5 by moving the first converging point P1 of the laser light L1 along the line to cut 5 while converging the laser light L1 having a wavelength larger than 1064 nm on the silicon substrate 10 with the rear face 10b of the silicon substrate 10 as the laser light entrance surface to maintain the distance between the front face 10a of the silicon substrate 10 and the first converging point P1 of the laser light L to be a first distance (first step). At this time, the first converging point P1 of the laser light L1 is moved along the line to cut 5 while maintaining the distance by which the first converging point P1 of the laser light L1 is offset in the direction perpendicular to both the thickness direction of the silicon substrate 10 and the extending direction of the line to cut 5 with respect to the line to cut 5 to be zero. That is, the first converging point P1 of the laser light L is moved along the line to cut 5 while maintaining a state where the first converging point P1 of the laser light L is positioned on the line to cut 5 as viewed from the thickness direction of the silicon substrate 10. As a result, the first modified region 7a is formed inside the silicon substrate 10 along the line to cut 5 in the state of being positioned on the line to cut 5 as viewed from the thickness direction of the silicon substrate 10.

Subsequently, the second modified region 7b is formed along each of the lines to cut 5 set in a lattice shape so as to pass between adjacent functional devices. More specifically, the second modified region 7b is formed along the line to cut 5 by moving the second converging point P2 of the laser light L1 along the line to cut 5 while converging the laser light L1 having a wavelength larger than 1064 nm on the silicon substrate 10 with the rear face 10b of the silicon substrate 10 as the laser light entrance surface to maintain the distance between the front face 10a of the silicon substrate 10 and the second converging point P2 of the laser light L1 to be a second distance that is longer than the first distance and offsetting the second converging point P2 of the laser light L1 (second step). In other words, while viewing the thickness direction of the silicon substrate 10, the second converging point P2 of the laser light L is kept away from the line to cut 5 by a predetermined distance, and the second converging point P2 of the laser light L along the line to cut 5 (parallel to the line to cut 5) is moved. As a result, the second modified region 7b is formed inside the silicon substrate 10 along the line to cut 5 (to be parallel to the line to cut 5) in the state of being away from the line to cut 5 by a predetermined distance as viewed from the thickness direction of the silicon substrate 10.

As a result, the crack F extending in the thickness direction of the silicon substrate 10 from the first modified region 7a and the second modified region 7b reaches the front face 10a of the silicon substrate 10, and the functional device layer 15 is cut for each functional device. Incidentally, as an example, a thickness of the silicon substrate 10 is 775 μm, and the first modified region 7a and the second modified region 7b are formed in a region from the front face 10a of the silicon substrate 10 to a depth of 160 μm.

The above first and second steps are performed by the laser processing device 100 described above. That is, the support table 107 supports the object to be processed 1. The laser light source 101 emits the laser light L1 having a wavelength larger than 1064 nm. The condenser lens (condenser optical system) 105 causes the laser light L1 emitted from the laser light source 101 to be converged on the object to be processed 1 supported by the support table 107 such that the rear face 10b of the silicon substrate 10 serves as the laser light entrance surface. Then, the stage control unit (control unit) 115 and the laser light source control unit (control unit) 102 control the operations of the support table 107 and the laser light source 101, respectively, so as to perform the above-described first and second steps. Incidentally, the movement of the first converging point P1 and the second converging point P2 of the laser light L with respect to the line to cut 5 may be implemented by the operation on the condenser lens 105 side or by both the operations of the support table 107 side and the condenser lens 105 side.

Figure 20:
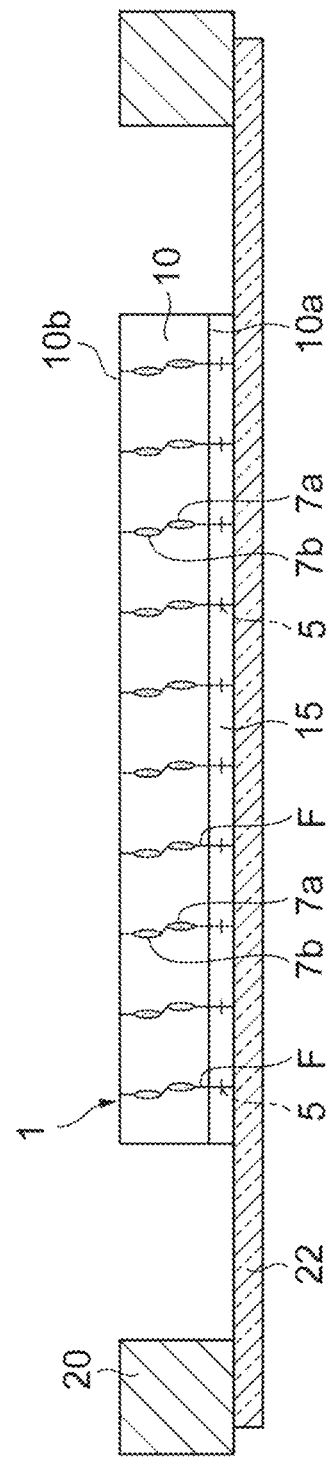
FIG. 20 is a cross-sectional view for describing the method of manufacturing the semiconductor chip using the laser processing method of the embodiment.

Subsequently, the rear face 10b of the silicon substrate 10 is polished to thin the object to be processed 1 to have a predetermined thickness as illustrated in FIG. 20. As a result, the crack F extending in the thickness direction of the silicon substrate 10 from the first modified region 7a and the second modified region 7b reaches the rear face 10b of the silicon substrate 10, and the object to be processed 1 is cut for each functional device. Incidentally, as an example, the silicon substrate 10 is thinned to have a thickness of 200 μm.

Figure 21:
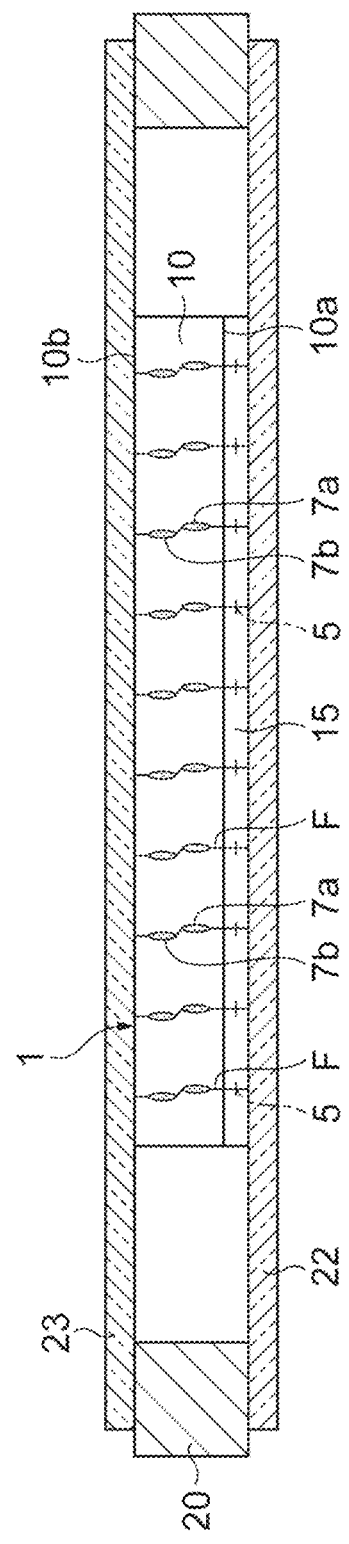
FIG. 21 is a cross-sectional view for describing the method for manufacturing the semiconductor chip using the laser processing method of the embodiment.
Figure 22:
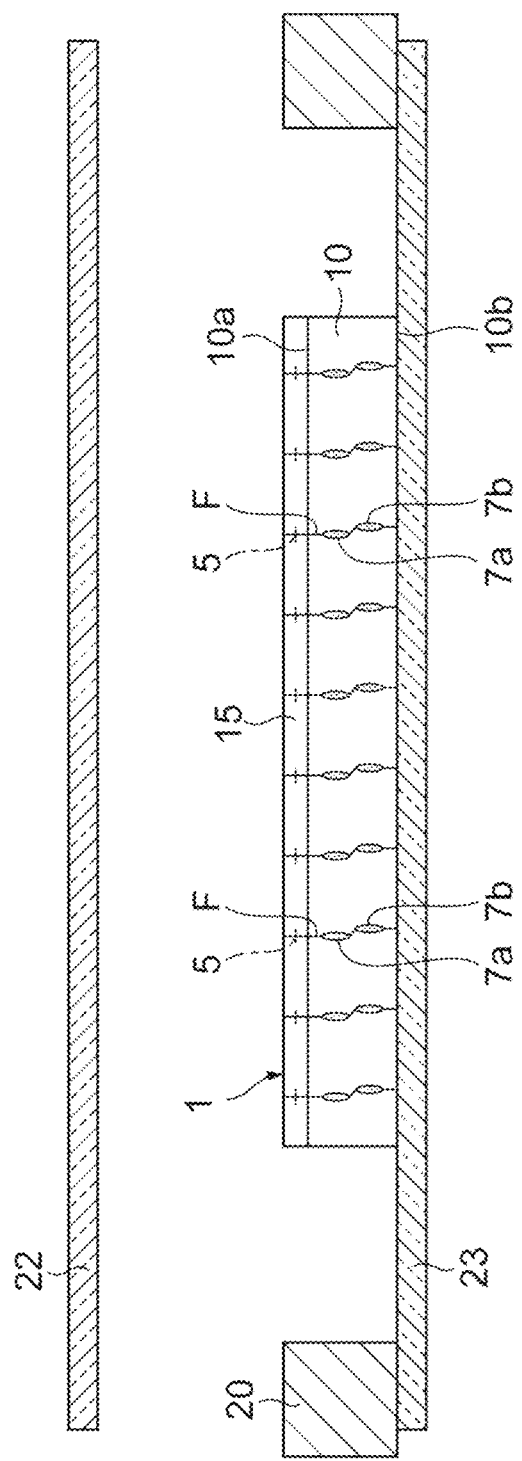
FIG. 22 is a cross-sectional view for describing the method for manufacturing the semiconductor chip using the laser processing method of the embodiment.
Figure 23:
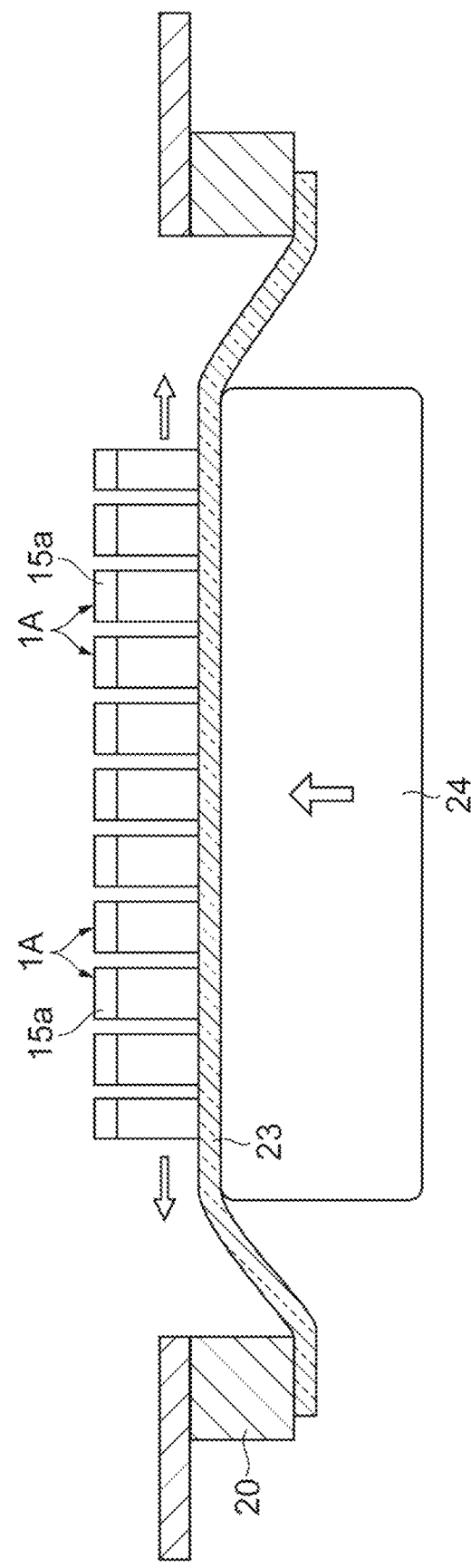
FIG. 23 is a cross-sectional view for describing the method for manufacturing the semiconductor chip using the laser processing method of the embodiment.
Figure 24:
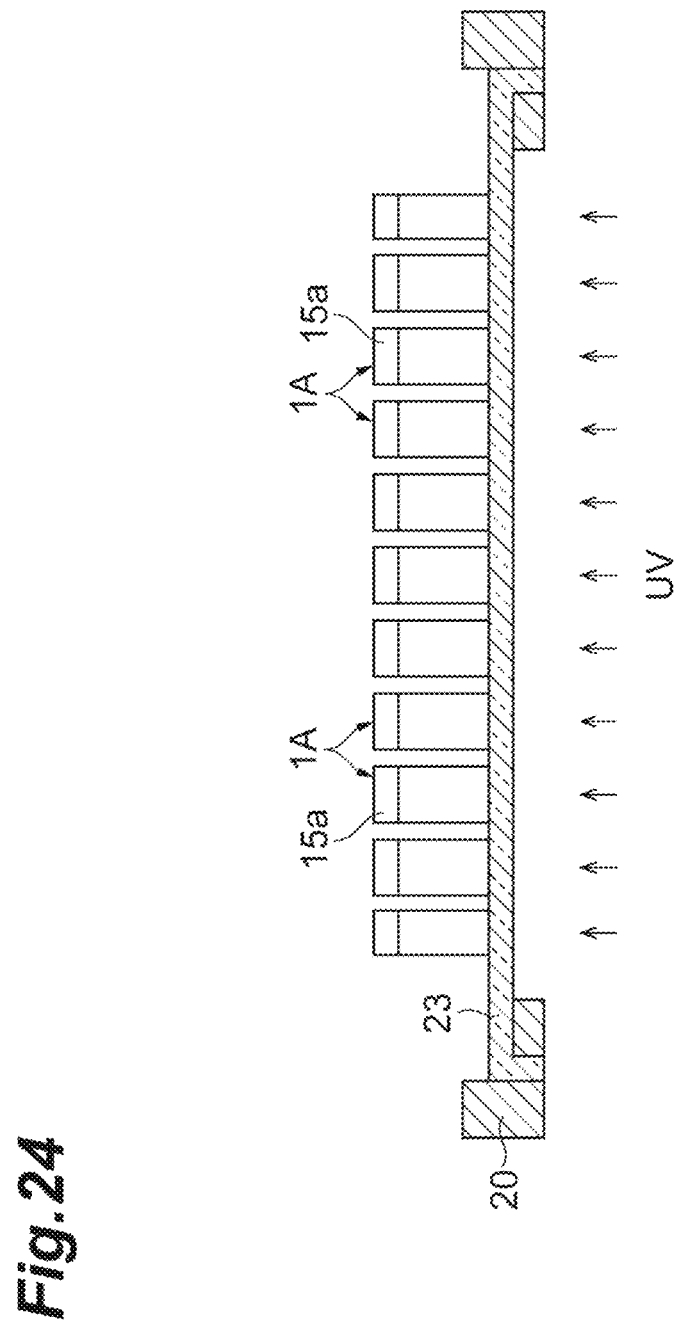
FIG. 24 is a cross-sectional view for describing the method of manufacturing the semiconductor chip using the laser processing method of the embodiment.

Subsequently, an extension film 23 is pasted to the rear face 10b of the silicon substrate 10 and the holding member 20 as illustrated in FIG. 21. Subsequently, the protective film 22 is removed as illustrated in FIG. 22. Subsequently, the object to be processed 1 cut for each functional device 15a, that is, a plurality of semiconductor chips 1A are separated from each other by pressing a pressing member 24 against the extension film 23 as illustrated in FIG. 23. Subsequently, an adhesive force of the extension film 23 is lowered by irradiating the extension film 23 with ultraviolet rays as illustrated in FIG. 24, and each of the semiconductor chips 1A is picked up.

Figure 25:
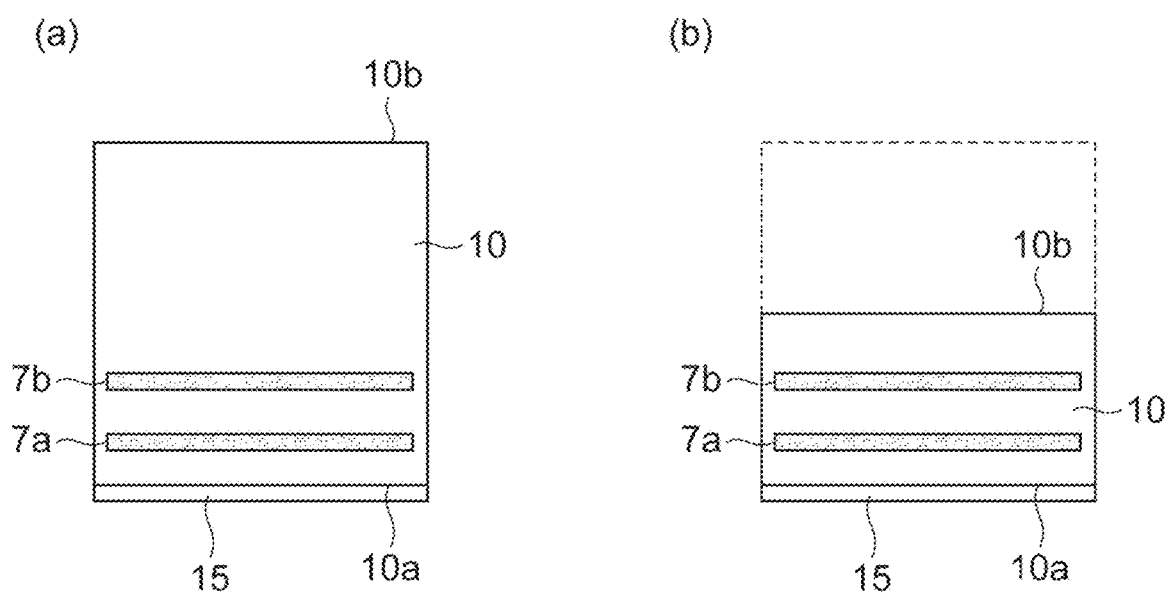
FIG. 25(a) is a cross-sectional view taken along the line to cut of the object to be processed before polishing.
FIG. 25(b) is a cross-sectional view taken along the line to cut of the object to be processed after polishing.
Figure 26:
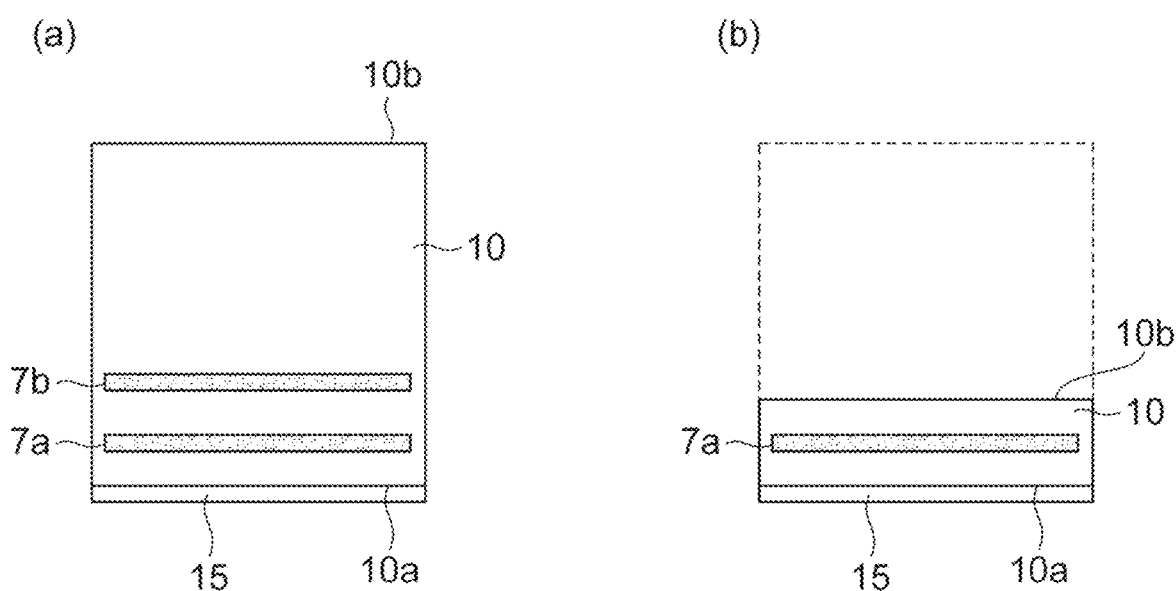
FIG. 26(a) is a cross-sectional view taken along the line to cut of the object to be processed before polishing.
FIG. 26(b) is a cross-sectional view taken along the line to cut of the object to be processed after polishing.
Figure 27:
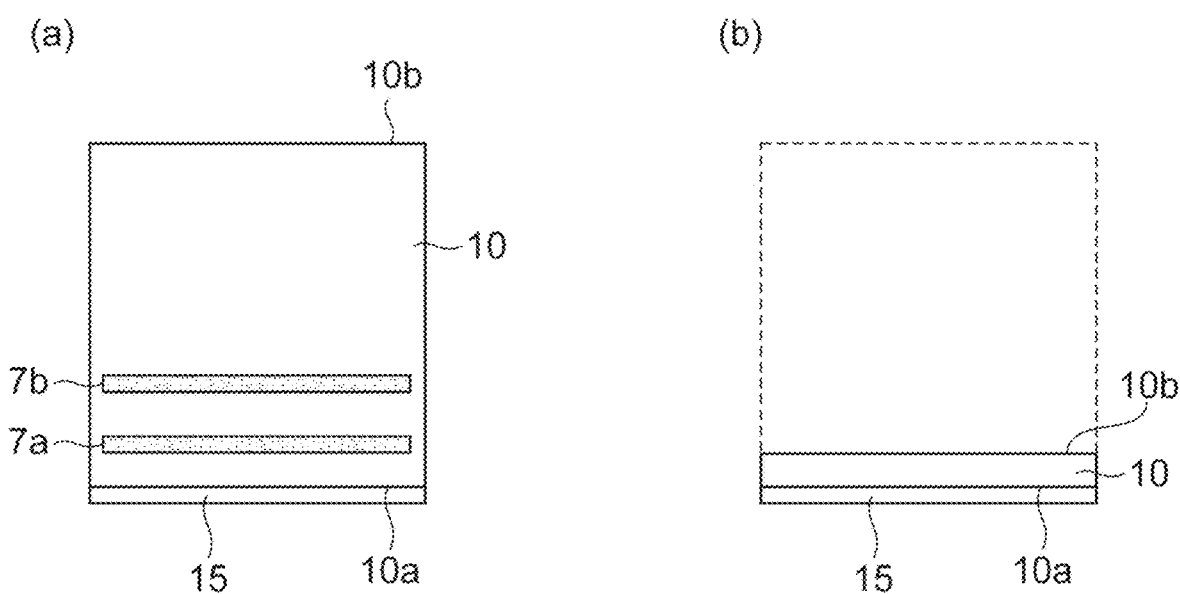
FIG. 27(a) is a cross-sectional view taken along the line to cut of the object to be processed before polishing.
FIG. 27(b) is a cross-sectional view taken along the line to cut of the object to be processed after polishing.

Incidentally, when polishing the rear face 10b of the silicon substrate 10, the rear face 10b of the silicon substrate 10 may be polished such that the first modified region 7a and the second modified region 7b remain as illustrated in FIGS. 25(a) and 25(b), the rear face 10b of the silicon substrate 10 may be polished such that the first modified region 7a remains and the second modified region 7b does not remain as illustrated in FIGS. 26(a) and 26(b), or the rear face 10b of the silicon substrate 10 may be polished such that none of the first modified region 7a and the second modified region 7b remain as illustrated in FIGS. 27(a) and 27(b).

As described above, the laser light L1 having a wavelength larger than 1064 nm is used in the laser processing method and the laser processing device 100 of the embodiment. As a result, it is possible to greatly extend the crack F in the thickness direction of the silicon substrate 10 from the first modified region 7a and the second modified region 7b along with the formation of the first modified region 7a and the second modified region 7b as compared with the case of using the laser light L0 having a wavelength of 1064 nm or smaller. Further, the second converging point P2 of the laser light L1 is offset at the time of forming the second modified region 7b. As a result, it is possible to suppress the generation of the splash S on the front face 10a of the object to be processed 1 on the side opposite to the laser light entrance surface. Accordingly, it is possible to improve the processing efficiency while suppressing the generation of the splash S according to the laser processing method and the laser processing device 100 of the embodiment.

Incidentally, it is possible to more greatly extend the crack F in the thickness direction of the silicon substrate 10 from the first modified region 7a and the second modified region 7b along with the formation of the first modified region 7a and the second modified region 7b when using the laser light L1 having a wavelength of 1099 µm or larger and 1342 µm or smaller. In particular, the laser light L1 having a wavelength of 1342 µm can extend the crack F more greatly.

In addition, when the offset amount for offsetting the second converging point P2 of the laser light L1 at the time of forming the second modified region 7b is set to 24 µm or shorter, the crack F can be reliably connected between the first modified region 7a and the second modified region 7b, and the crack F can be reliably extended in the thickness direction of the silicon substrate 10 from the first modified region 7a and the second modified region 7b along with the formation of the first modified region 7a and the second modified region 7b. Further, when the offset amount is set to 4 µm or longer and 18 µm or shorter, the crack F can be more reliably connected between the first modified region 7a and the second modified region 7b, and the crack F can be more reliably extended in the thickness direction of the silicon substrate 10 from the first modified region 7a and the second modified region 7b. In particular, when the offset amount is set to 6 µm or longer and 16 µm or shorter, it is possible to realize the suppression of generation of splash S and the connection and extension of the crack F in a well-balanced manner.

In addition, in the laser processing method and the laser processing device 100 of the embodiment, the first converging point P1 of the laser light L1 is moved along the line to cut 5 while maintaining the distance by which the first converging point P1 of the laser light L1 is offset in the direction perpendicular to both the thickness direction of the silicon substrate 10 and the extending direction of the line to cut 5 with respect to the line to cut 5 to be zero at the time of forming the first modified region 7a. As a result, the crack F extending from the first modified region 7a to the front face 10a side of the silicon substrate 10 can be aligned on the line to cut 5.

Although the embodiment of the present disclosure has been described as above, one aspect of the present disclosure is not limited to the above-described embodiment, and may be modified or applied to other embodiments within a scope not changing a gist described in each claim.

For example, the first converging point P1 of the laser light L1 may be offset to one side in the direction perpendicular to both the thickness direction of the silicon substrate 10 and the extending direction of the line to cut 5 with respect to the line to cut 5 at the time of forming the first modified region 7a, and the second converging point P2 of the laser light L1 may be offset to the other side in the direction perpendicular to both the thickness direction of the silicon substrate 10 and the extending direction of the line to cut 5 with respect to the line to cut 5 at the time of fainting the second modified region 7b. That is, the first converging point P1 of the laser light L may be moved along the line to cut 5 (in parallel to the line to cut 5) while maintaining a state where the first converging point P1 of the laser light L is away from the line to cut 5 by a predetermined distance on one side as viewed from the thickness direction of the silicon substrate 10 at the time of forming the first modified region 7a, and the second converging point P2 of the laser light L may be moved along the line to cut 5 (in parallel to the line to cut 5) while maintaining a state where the second converging point P2 of the laser light L is away from the line to cut 5 by a predetermined distance on the other side as viewed from the thickness direction of the silicon substrate 10 at the time of forming the second modified region 7b. As a result, the first modified region 7a is fainted inside the silicon substrate 10 along the line to cut 5 (in parallel to the line to cut 5) in the state of being away from the line to cut 5 by the predetermined distance on one side as viewed from the thickness direction of the silicon substrate 10, and the second modified region 7b is formed inside the silicon substrate 10 along the line to cut 5 (in parallel to the line to cut 5) in the state of being away from the line to cut 5 by the predetermined distance on the other side as viewed from the thickness direction of the silicon substrate 10. In this case, it is possible to form the first modified region 7a and the second modified region 7b on one side and the other side with respect to the line to cut 5 in a well-balanced manner.

In addition, one aspect of the present disclosure is not limited to the example of performing the step (first step) of forming the first modified region 7a with respect to all the lines to cut 5 set in a lattice shape, and then, performing the step (second step) of forming the second modified region 7b with respect to all the lines to cut 5 set in the lattice shape. As another example, the step (first step) of forming the first modified region 7a and the step (second step) of forming the second modified region 7b may be performed as follows. First, the step (first step) of forming the first modified region 7a is performed with respect to the line to cut 5 extending in a first direction among all the lines to cut 5 set in the lattice shape, and then, the step (second step) of forming the second modified region 7b is performed with respect to the line to cut 5 extending in the first direction. Subsequently, the step (first step) of forming the first modified region 7a is performed with respect to the line to cut 5 extending in a second direction (a direction perpendicular to the first direction) among all the lines to cut 5 set in the lattice shape, and then, the step (second step) of forming the second modified region 7b is performed with respect to the line to cut 5 extending in the second direction. In addition, the step (first step) of forming the first modified region 7a may be performed for each single line to cut 5 with respect to the plurality of lines to cut 5, and then, the step (second step) of forming the second modified region 7b may be performed. That is, the step (first step) of forming the first modified region 7a and the step (second step) of forming the second modified region 7b may be performed for the single line to cut 5, and subsequently, the step (first step) of forming the first modified region 7a and the step (second step) of forming the second modified region 7b may be performed for another single line to cut 5.

In addition, it is not necessary to polish the rear face 10b of the silicon substrate 10 after the step (first step) of forming the first modified region 7a and the step (second step) of forming the second modified region 7b. It is sometimes possible to cut the object to be processed 1 along the line to cut 5 without polishing the rear face 10b of the silicon substrate 10 when the thickness of the object to be processed 1 is relatively small with respect to the number of rows of the modified region 7 to be formed per single line to cut 5, or when the number of rows of the modified region 7 to be formed per single line to cut 5 is relatively large with respect to the thickness of the object to be processed 1, or the like.

REFERENCE SIGNS LIST

1 . . . object to be processed, 5 . . . line to cut, 7a . . . first modified region, 7b . . . second modified region, 10 . . . silicon substrate, 10a . . . front face, 10b . . . rear face, 15a . . . functional device, 100 . . . laser processing device, 101 . . . laser light source, 102 . . . laser light source control unit (control unit), 105 . . . condenser lens (condenser optical system), 107 . . . support table, 115 . . . stage control unit (control unit), L1 . . . laser light, P1 . . . first converging point, P2 . . . second converging point

The invention claimed is:

1. A laser processing method comprising:

a first step of converging laser light having a wavelength larger than 1064 nm on an object to be processed including a silicon substrate having a plurality of functional devices formed on a front face thereof with a rear face of the silicon substrate as a laser light entrance surface and moving a first converging point of the laser light along a line to cut which is set so as to pass between adjacent functional devices while maintaining a distance between the front face of the silicon substrate and the first converging point of the laser light to be a first distance, and thereby forming a first modified region along the line to cut; and a second step of converging the laser light having the wavelength larger than 1064 nm on the object to be processed with the rear face of the silicon substrate as the laser light entrance surface after the first step and moving a second converging point of the laser light along the line to cut while maintaining a distance between the front face of the silicon substrate and the second converging point of the laser light to be a second distance longer than the first distance and offsetting the second converging point of the laser light in a direction perpendicular to both a thickness direction of the silicon substrate and an extending direction of the line to cut with respect to a position where the first converging point of the laser light is aligned, and thereby forming a second modified region along the line to cut, wherein in the first step, the first converging point of the laser light is moved along the line to cut while maintaining a distance by which the first converging point of the laser light is offset in the direction perpendicular to both the thickness direction of the silicon substrate and the extending direction of the line to cut, with respect to the line to cut, to be zero, wherein the line to cut in the first step and the line to cut in the second step is the same line to cut, wherein in the first step, the first modified region is formed and thereby a crack extends from the first modified region and does not reach the front face of the silicon substrate, and wherein in the second step, the second modified region is formed and thereby the crack is connected between the first modified region and the second modified region, and the crack reaches the front face of the silicon substrate.

2. The laser processing method according to claim 1, wherein the laser light has a wavelength of 1099 nm or larger and 1342 nm or smaller.

3. The laser processing method according to claim 1, wherein a distance by which the second converging point of the laser light is offset in the direction perpendicular to both the thickness direction of the silicon substrate and the extending direction of the line to cut with respect to the position where the first converging point of the laser light is aligned is 24 µm or shorter.

4. The laser processing method according to claim 3, wherein the distance by which the second converging point of the laser light is offset in the direction perpendicular to both the thickness direction of the silicon substrate and the extending direction of the line to cut with respect to the position where the first converging point of the laser light is aligned is 4 µm or longer and 18 µm or shorter.

5. The laser processing method according to claim 1, wherein the crack extends straight along the line to cut from the first modified region to the front face of the silicon substrate in the second step.

* * * * *